United States Patent [19]

Iwasaki et al.

[11] Patent Number: 5,407,867
[45] Date of Patent: Apr. 18, 1995

[54] METHOD OF FORMING A THIN FILM ON SURFACE OF SEMICONDUCTOR SUBSTRATE

[75] Inventors: Masanobu Iwasaki; Hiromi Itoh; Akira Tokui; Katsuyoshi Mitsui; Katsuhiro Tsukamoto, all of Hyogo, Japan

[73] Assignee: Mitsubishki Denki Kabushiki Kaisha, Tokyo, Japan

[21] Appl. No.: 948,528

[22] Filed: Sep. 22, 1992

Related U.S. Application Data

[62] Division of Ser. No. 724,488, Jun. 28, 1991, Pat. No. 5,174,881.

[30] Foreign Application Priority Data

May 12, 1988 [JP] Japan .................. 63-117733
Dec. 13, 1988 [JP] Japan .................. 63-315810

[51] Int. Cl.⁶ .......................................... H01L 21/465
[52] U.S. Cl. ................................ 437/228; 47/225; 47/235
[58] Field of Search ................... 437/225, 228, 235

[56] References Cited

U.S. PATENT DOCUMENTS

| | | | |
|---|---|---|---|
| 4,025,410 | 5/1977 | Stewart | 204/298.16 X |
| 4,183,780 | 1/1980 | McKenna | 156/643 |
| 4,351,714 | 9/1982 | Kuriyama | 204/298.26 |
| 4,590,091 | 5/1986 | Rogers, Jr. et al. | 427/582 |
| 4,597,826 | 7/1986 | Majima et al. | 156/643 |
| 4,605,479 | 8/1986 | Faith, Jr. | 204/192.17 |
| 4,678,536 | 7/1987 | Murayama et al. | 156/635 |
| 4,689,112 | 8/1987 | Bersin | 156/643 |
| 4,716,852 | 1/1988 | Tsujii et al. | 118/715 |
| 4,724,159 | 2/1988 | Yamazaki | 427/568 |
| 4,808,553 | 2/1989 | Yamazaki | 437/100 |
| 4,871,416 | 10/1989 | Fukuda | 156/635 |
| 4,902,671 | 2/1990 | Koinuma | 505/475 |

FOREIGN PATENT DOCUMENTS

60-53032 3/1985 Japan .
61-27621 2/1986 Japan .
61-124123 6/1986 Japan .

OTHER PUBLICATIONS

Kinsoron et al., "Crystallization of Amorphous Silicon Films During Low Pressure Chemical Vapor Deposition," *Appl. Phys. Lett.*, vol. 42, No. 9, pp. 835–837, May 1, 1983.

Sugino et al., "Through-Oxide Cleaning of Silicon Surface by Photo-Excited Radicals," Extended Abstracts of the 19th Conference on Solid State Devices and Materials, Tokyo, 1987, pp. 207–210.

*Primary Examiner*—Aaron Weisstuch
*Attorney, Agent, or Firm*—Lowe, Price, LeBlanc & Becker

[57] ABSTRACT

A method of and an apparatus for removing a naturally grown oxide film and contaminants on the surface of a semiconductor substrate and then forming a thin film on the cleaned surface. The semiconductor substrate is placed in a pretreatment chamber and then hydrogen chloride gas is introduced into the chamber. Then, the semiconductor substrate is heated at a temperature between 200° ~ 700° C. and the surface of the semiconductor substrate is irradiated with ultraviolet rays, whereby the naturally grown oxide film and other contaminants on the semiconductor substrate can be removed. Then, a thin film is formed on the cleaned surface of the semiconductor substrate by a CVD method or a sputter method. According to this method, the naturally oxide film and other contaminants can be removed from the surface of the semiconductor substrate at a low temperature and the thin film can be formed on the cleaned surface. As a result, an interface structure between the semiconductor substrate and the thin film can be controlled to be in a preferable state.

10 Claims, 15 Drawing Sheets

METHOD OF FORMING A THIN FILM ON SURFACE OF SEMICONDUCTOR SUBSTRATE

This application is a division of application Ser. No. 07/724,488, filed Jun. 28, 1991, now U.S. Pat. No. 5,174,881.

BACKGROUND OF THE INVENTION

1. Field of the Invention

The present invention relates to a method of and an apparatus for forming a thin film on a surface of a semiconductor substrate and, more particularly, to a method of and an apparatus for forming a thin film in which an interface structure between the semiconductor substrate and the thin film is reliably controlled.

2. Description of the Background Art

Characteristics of electronics devices are readily and adversely affected by contaminants introduced on purpose or by accident in the course of the manufacturing process. In order to avoid any introduction of contaminants into the electronics products as much as possible, it is necessary to keep the whole manufacturing environment at a maximum possible degree of cleanliness. In this connection, highly advanced cleaning and purifying technologies are employed to produce desired starting materials and processing environments for the manufacture of the devices.

The manufacturing process for semiconductor devices is roughly divided into the steps of forming thin films and a circuit pattern. The process for forming thin films on the semiconductor substrate is further divided into many subprocesses depending on the materials of which the thin films are made and techniques to be used. Various cleaning technologies for each of the subprocesses or to be shared by some of the subprocesses have been developed into practical use. Important and essential to all these subprocess is the pretreatment of the semiconductor substrate which is performed prior to forming the thin films on the substrate.

In the pretreatment process, the semiconductor substrate is cleaned with water, acid or alkalis, and it is subjected to chemical oxidation or a treatment with dilute hydro-fluoric acid, for the removal of grease, heavy metals, naturally grown oxide film and the like. These solution cleaning techniques are widely used in the industry but their decisive disadvantage is that the cleaned semiconductor substrate is unavoidably exposed to the surrounding air before it is coated with the thin film in a subsequent process. The exposure to the air causes a thin oxide film to grow on the substrate surface, especially when the substrate contains an active semiconductor substance or it has exposed metal portions thereon. For this reason, the substrate cleaning with solutions falls short of complete cleaning of the substrate surface although it is effective to remove heavy metals and organic contaminants.

The growth of a natural oxide film on the semiconductor substrate has an adverse effect on the quality of various films to be formed on the substrate in a subsequent step. The thin films provided on the semiconductor substrate include epitaxially grown layers, layers of high melting point metals or polysilicide layers, electrical interconnection layers, and ultra-thin insulating layers. The formation of these layers on the semiconductor substrate is growing in importance as the degree of integration of semiconductor devices advances. Therefore, in order to remove harmful contaminants in the film and also improve the quality of the thin film, an effective method of forming a thin film on the semiconductor substrate with a well-controlled interface between them has been long been waited for.

FIG. 15 is a sectional view of a conventional sputtering apparatus capable of processing a plurality of semiconductors at the same time. Referring to FIG. 15, the conventional sputtering apparatus comprises a chamber 20. The chamber 20 is divided into a loader chamber 22, an etching chamber 23, a deposition chamber 24 and an unloader chamber 25 by lock valves 21a, 21b and 21c.

The loader chamber 22 comprises a nitrogen gas inlet 26a and an outlet 9a. In the loader chamber 22, a carrier system 27a such as belt conveyer is provided.

The etching chamber 23 comprises an Argon gas inlet 28a for introducing Argon gas and an outlet 9b. In the etching chamber 23, a carrier system 27b is provided. The etching chamber 23 comprises a substrate supporting plate 29a. A tray 30 is placed on the substrate supporting plate 29a and a semiconductor substrate such as a silicon substrate 4 is put on the tray 30. A high frequency power supply 31 is connected to the silicon substrate through a matching circuit 32. The substrate supporting plate 29a is insulated from the chamber 20 by an insulating portion 33a.

The deposition chamber 24 comprises an Argon gas inlet 28b for introducing Argon gas and an outlet 9c. A carrier system 27c is provided in the deposition chamber 24. The deposition chamber 24 comprises a substrate supporting plate 29b. In addition, the deposition chamber 24 comprises a target 34. The DC power supply 35 is connected to the target 34 and a high voltage is applied between the target 34 and the substrate supporting plate. The substrate supporting plate 29b is insulated from the chamber 20 by an insulating portion 33b and the target 34 is insulated from the chamber 20 by the insulating portion 33b.

The unloader chamber 25 comprises a nitrogen gas inlet 26b and an outlet 9d. A carrier system 27d is provided in the unloader chamber 25.

A description is made of a method of forming a thin film on the substrate using this device.

First, the loader chamber 22, the etching chamber 23, the deposition chamber 24 and the unloader chamber 25 are highly evacuated, respectively. Then, nitrogen gas is introduced through the nitrogen gas inlet 26a to the loader chamber 22 which is held in the evacuated state, and the pressure in the chamber is returned to below atmospheric pressure. Then, a door (not shown) is opened to introduce a plurality of silicon substrates 4 on the tray 30 to the loader chamber 22 and then the door is closed again. Next, the loader chamber 22 is evacuated through the outlet 9b by a vacuum pump (not shown) to a high degree. The lock valve 21a is opened to drive a motor of the carrier system 27a and move the silicon substrate 4 on the tray 30 to the etching chamber 23, and the lock valve 21a is closed. The operation of the lock valve 21 and the carrier system 27a is performed by switching means (not shown) which is, for example externally provided. The etching chamber 23 is held in the high vacuum state of approximately $10^{-7} \sim 10^{-8}$ Torr. Then, Argon gas of $10^{-3} \sim 10^{-1}$ Torr is introduced to the etching chamber 23 through the Argon gas inlet 28a. Plasma is formed by applying a bias of several hundreds to several thousands of volts between the substrate 4 and the chamber walls by the high frequency power supply 31. Argon ions in this plasma collide with the substrate 4 which is held at a side of negative high voltage with high energy and sputter-etch the natural oxide film or contaminants adhering to the surface of the silicon substrate 4. After the sputter-etching is completed, the introduction of the Argon gas and the application of the bias are stopped. The Argon gas in the etching chamber 23 is evacuated and the etching chamber 23 is made to be in the high vacuum state. Then, lock valve 21b is opened to permit the motor drive of the carrier system 27b to move the silicon substrate 4 on the tray 30 to the deposition chamber 24, and then the lock valve 21b is closed. At this time, a second plurality of silicon substrates 4 is moved into the etching chamber 23. The deposition chamber 24 is also held in the high vacuum state of approximately $10^{-7} \sim 10^{-8}$ Torr. Next, Argon gas of $10^{-3} \sim 10^{-1}$ Torr is introduced to the deposition chamber 24 through the Argon gas inlet 28b. Then, a voltage of several hundreds to several thousands of volts is applied between the target 34 and the Argon gas by the DC power supply 35, whereby a plasma is formed. Argon ions in this plasma collide with the target 34 held at a negative high voltage with high energy to sputter the substance on the target 34. This substance is deposited on the silicon substrate 4 and the thin film is formed. After the formation of the thin film having a desired film thickness, uniformity, and quality is completed, the introduction of the Argon gas and the application of a voltage are stopped and then the deposition chamber 24 is evacuated to be in the high degree of vacuum state.

Then, the lock valve 21c is opened to permit the motor drive of the carrier system 27c to move the substrates 4 on the tray 30 to the unloader chamber 25 and then the lock valve 21c is closed. At this time, the second plurality of substrates is moved to the deposition chamber 24 and the third substrates 1 are moved to the etching chamber 23. The silicon substrates 4 etched and deposited sequentially are housed in a cassette in the unloader chamber 25. After the last silicon substrates 4 are housed in the cassette, the pressure in the unloader chamber 25 is returned to atmospheric pressure and the silicon substrates 4 having a desired thin film are taken out together with the cassette to be sent to the subsequent process station.

Since the conventional apparatus for forming a thin film by sputtering is structured as described above, it is necessary to apply a high bias between the silicon substrate 4 and the chamber walls in order to remove the natural oxide film or contaminants by sputter-etching with plasma of an inert gas such as Argon. However, there was a disadvantage in that the Argon plasma caused the silicon substrate 4 to be damaged.

The following method is also known, wherein the natural oxide film or contaminant is removed by gas etching by high-temperature hydrogen reduction technique and then the thin films are continuously formed thereon. However, since this high-temperature hydrogen reduction technique requires a high temperature (usually above 1,000° C.), thermal fusion at the PN junction is caused, making its application limited.

Japanese Patent Laying-Open No. 27,621/1986 discloses another technique for removing the natural oxide film by heating the silicon substrate at a temperature of 800° ~ 1,000° C. in the presence of a hydrogen stream. However, such a high temperature caused not only the above-mentioned thermal fusion but also caused amorphous silicon in the substrate to be turned into polysilicon with the crystallization advanced as pointed out, for example, by (E. Kinsbron, M. Stenheim, and R. Knoell, Appl. Phys. Lett, Vol. 42, No. 9, 835, 1 May 1983). In view of the fact that it is desirable for polysilicon to be in the almost amorphous state with a minimum possible grain size as the substrate material in recent device manufacturing technologies, the formation of polysilicon with the advanced crystallization is not desired.

Japanese Patent Laying-Open No. 124,123/1986 discloses a process for treating the semiconductor substrate by first letting the substrate absorb a reactive gas, and then etching the substrate surface with the above reactive gas under the irradiation of light. Although this process is seemingly applicable to the removal of the natural oxide film on the semiconductor substrate, the patent fails to disclose the type of the light and reactive gas to be employed as well as the temperature at which the substrate is to be heated. If the disclosed treatment is applied in stripping the natural oxide film as it is, it is disadvantageous in that the reaction gas absorbed in the semiconductor substrate functions to etch not only the oxide film on the substrate surface but the substrate itself.

SUMMARY OF THE INVENTION

It is, therefore, an object of the present invention to provide a method of and apparatus for removing a naturally grown oxide film and other contaminants from the substrate surface and continuously forming thin films on the cleaned semiconductor substrate without exposing it to the air, at relatively lowered temperatures without giving any damage to the substrate surface.

The present inventors have long been engaged in research on the pretreatment of semiconductor substrates. We also have made researches into the method of removing the naturally grown oxide film and other contaminants from the surface of the semiconductor substrate. As a result of our continued research, we have discovered that the natural oxide film and other contaminating substances are effectively removed at relatively low temperatures by moderately heating a semiconductor substrate within a chamber in the presence of a gas which is reactive with the oxide film or other contaminants, and under the illumination of light. The discovery has led us to this invention. The present invention is directed, therefore, to a method of removing a naturally grown oxide film and other contaminants and forming thin films on the cleaned surface and includes the steps of: placing a semiconductor substrate in a pretreatment chamber; introducing into the pretreatment chamber a gas which is reactive to the natural oxide film and other contaminants on the substrate; heating the substrate at a temperature between 200° ~ 700° C.; irradiating the reactive gas with rays of light having a wavelength which is effective to cause and promote a photochemical reaction between the reactive gas and the naturally grown oxide film and other contaminants on the semiconductor substrate while heating the substrate up to the stated elevated temperatures; and moving the semiconductor substrate into the chamber for the formation of the thin film without exposing it to the air after removing the natural oxide film and other contaminants on the semiconductor substrate surface by the photochemical reaction under the elevated temperatures; and forming the thin film on the surface of said semiconductor device.

In the above-mentioned method, the removal of the natural oxide film and other contaminants on the surface of the semiconductor substrate and the formation of the above-mentioned thin film may be performed in the same chamber by combining two chambers for pretreating and forming the thin film into one chamber.

Alternatively, the chamber for pretreating and the chamber for forming the thin film may be provided separately, so that the removal of the natural oxide film and the other contaminants on the semiconductor substrate surface and the formation of the thin film may be performed in the respective chambers.

The above-mentioned thin film may be also formed by moving the semiconductor substrate into a gas atmosphere controlled such that the natural oxide film may not be formed again, after removing the natural oxide film and other contaminants adhering to the semiconductor substrate surface in the pretreatment chamber, and then moving the semiconductor substrate into the chamber for forming the thin film.

The above-mentioned method of forming the thin film, although it is not particularly specified, preferably employs a chemical deposition or sputtering deposition.

The thin film, although it is not particularly defined, is preferably a monocrystal silicon film, a polycrystalline silicon film, or an amorphous silicon film. In addition, it may be an insulating thin film comprising a silicon nitride film or a silicon oxide film. Furthermore, it may be a thin film of high melting point metals comprising tungsten, molybdenum, tantalum or titanium, or a silicide compound of these high melting pint metals.

The thin film formed by the sputtering deposition, although it is not particularly specified, is preferably an insulating film, conductive film and the like.

Any gas which can absorb ultra violet rays may be suitably used as a reactive gas in the present invention without any restriction. For example, hydrogen chloride gas, hydrogen gas, chlorine gas or the like is used and hydrogen chloride gas is the most preferred one.

According to the present invention, the semiconductor substrate is heated up to a temperature within the range of 200°~700° C. As will be discussed later in detail with reference to data, the natural oxide layer on the substrate is removed too slowly at a temperature below 200° C., while at a temperature above 700° C. the oxide layer is removed fast enough but the above-described thermal fusion is caused and an amorphous silicon film is turned into a polysilicon film.

Any light may be used in the invention as long as it has a wavelength which causes and accelerates a photochemical reaction between the reactive gas introduced into the chamber and the natural oxide film and other contaminants on the semiconductor substrate at a temperature between 200°~700° C. Among them, light from a low-pressure mercury lamp, a high-pressure mercury lamp, a mercury xenon lamp or a source of excimer laser is suitable.

The pressure of the reaction gas is preferably in the range of atmospheric pressure to 0.1 Torr. In case of below 0.1 Torr, the natural oxide film is removed too slowly, while at a pressure above atmospheric pressure, not only the natural oxide film but also the substrate is etched away.

For the same purpose, light may be used as a means for heating the semiconductor substrate at a temperature within the range of 200°~700° C. The light source for heating the semiconductor substrate may be the same as that for irradiating the reaction gas. In this case, an Argon-arc lamp or a xenon-mercury lamp is preferably used.

The light for heating the semiconductor substrate may be infrared rays and the light for irradiating the reaction gas may be ultra violet rays.

An apparatus for forming a thin film on the clean surface after removing a natural oxide film and other contaminants on the surface of a semiconductor substrate comprises a pretreatment chamber housing the semiconductor substrate to be treated; reaction gas introducing means for introducing to the pretreatment chamber a gas capable of reacting with the natural oxide film and a other contaminants; heating means for heating the semiconductor substrate at a temperature within the range of 200°~700° C.; a light source irradiating the reaction gas; the light source having a wavelength causing a photochemical reaction of the natural oxide film and other contaminants on the semiconductor substrate surface with the reaction gas introduced into the pretreatment chamber at a temperature within the range of 200°~700° C., while the semiconductor substrate is heated; and thin film forming means for forming the thin film on the surface of the semiconductor substrate from which the natural oxide film and other contaminants were removed without exposing it to the air.

As the thin film forming means, although it is not particularly defined, a means for forming the thin film by chemical deposition or sputtering deposition is preferably used.

Although a light source is used without any restriction, a low pressure mercury lamp, a high pressure mercury lamp, a mercury xenon lamp, an Argon-arc lamp, an excimer laser or the like is preferably used.

The chamber for forming the thin film preferably comprises pressure adjusting means for adjusting the surrounding pressure in the chamber.

In addition, the pretreatment chamber preferably comprises pressure adjusting means for adjusting the surrounding pressure in the chamber within the range of atmospheric pressure to 0.1 Torr.

In addition, the wall of the pretreatment chamber is preferably coated with etch resistant material.

An apparatus for forming the thin film on the cleaned surface by sputtering deposition, after the natural oxide film and the other contaminants on the surface of the semiconductor substrate are removed, comprises a chamber housing the semiconductor substrate to be treated; reaction gas introducing means for introducing into the chamber a gas capable of reacting with the natural oxide film and the other contaminants; heating means for heating the semiconductor substrate at a temperature within the range of 200°~700° C.; a light source irradiating the reaction gas; the light source having a wavelength causing a photochemical reaction of the natural oxide film and the other contaminants on the semiconductor substrate surface with the reaction gas introduced into the chamber at a temperature within the range of 200°~700° C., while the semiconductor substrate is heated; a target provided in the chamber and providing elements of the thin film to be formed on the semiconductor substrate surface without the natural oxide film and other contaminants; and substrate moving means provided in the chamber for moving the semiconductor substrate, the substrate moving means moving the semiconductor substrate such that the surface of the semiconductor substrate may face the light source when the natural oxide film and the other contaminants on the semiconductor substrate are removed and moving the semiconductor substrate such that semiconductor substrate surface may face the target when the thin film is formed on the semiconductor substrate.

As briefly stated, the present invention intends to use light and heat in combination in order to remove the naturally grown oxide film and other contaminants from the surface of the semiconductor substrate with a reactive gas. If HCl gas is employed as the reactive gas, the natural oxide film is stripped off from the substrate surface according to a chemical reaction expressed as follows:

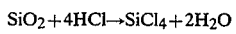

$$SiO_2 + 4HCl \rightarrow SiCl_4 + 2H_2O$$

The present invention takes advantage of the fact that the above-expressed reaction is greatly accelerated under the concurrent presence of heat and light. If a reactive gas cannot be activated under exposure only to light, the same gas is used to remove the naturally grown oxide film and the other contaminants from the semiconductor substrate. Although, it is normally necessary for the removal of the natural oxide film and the other contaminants to apply high temperature heat, they can be removed at a relatively low temperature according to the invention with the help of light energy.

As a result, the naturally grown oxide film and other contaminants on the semiconductor substrate surface can be removed at a temperature low enough without any damage on the surface of the semiconductor substrate. Since the thin film is formed on the thus provided clean surface of the semiconductor substrate without being exposed to the air, the natural oxide film and the like does not exist in the interface between the semiconductor substrate and the thin film. Therefore, an interface structure between the semiconductor substrate and the thin film can be controlled in a good state.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

A method of forming a thin film on the surface of a semiconductor substrate in accordance with the present invention comprises two main steps, that is, the steps of removing the naturally oxide film and other contaminants on the surface of the semiconductor substrate (referred to as a first step hereinafter), and forming the thin film on the surface of the semiconductor substrate without exposing it to the air after the natural oxide film and the other contaminants on the surface of the semiconductor substrate are removed (referred to as a second step hereinafter).

First, a description is made with reference to data, of how much of the naturally grown oxide film and the other contaminants are removed from the semiconductor substrate surface, during the first step.

Apparatus employed for performing the method of the present invention

Figure 1:
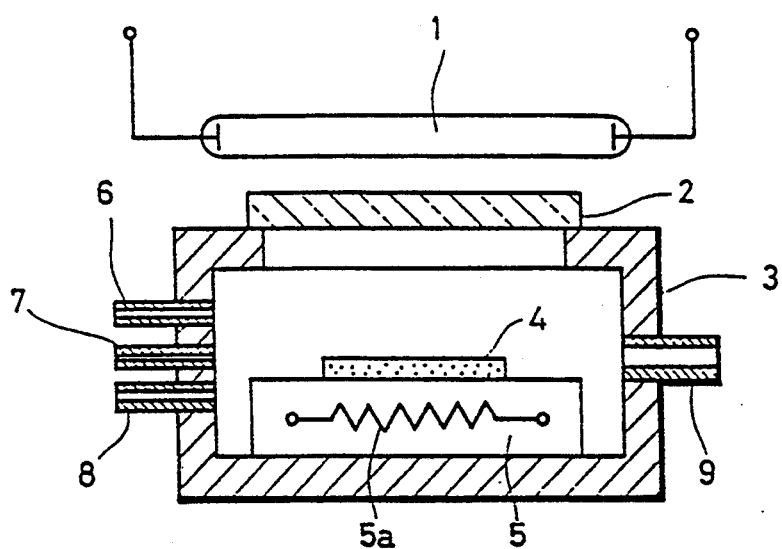
FIG. 1 is a sectional view of an apparatus for removing a naturally grown oxide film.

FIG. 1 is a sectional view of an apparatus employed.

Referring to FIG. 1, the apparatus comprises a chamber 3. The chamber 3 comprises an HCl gas inlet 6, a $SiH_2Cl_2$ gas inlet 7, an $NH_3$ gas inlet 8 and an outlet 9. Furthermore, the chamber 3 comprises a window 2 for passing ultra violet rays to the chamber 3. A low pressure mercury lamp 1 is placed facing the window 2. Within the chamber 3, a substrate supporting plate 5 is placed and a semiconductor substrate, for example a silicon substrate 4 is put on the substrate supporting plate 5. The substrate supporting plate 5 comprises heating means 5a, whereby the silicon substrate 4 can be heated through the substrate supporting plate 5.

Summary of the method of removing natural oxide film and other contaminants on semiconductor substrate surface Next, a summary of the method of removing the naturally grown oxide film and other contaminants on the surface of the semiconductor substrate is described using the above-described apparatus.

A silicon substrate 4 to be processed is positioned on the support 5. It is assumed that the silicon substrate under went a cleaning treatment with a solvent or solvents, but it is already covered with an oxide film which has naturally grown as a result of exposure of the substrate to the surrounding atmosphere following the cleaning step. Then, HCl gas is introduced onto the surface of the silicon substrate 4 in the chamber 3 through the inlet 6. By turning on the low pressure mercury lamp 1, the surface of the silicon substrate 4 is irradiated with the ultraviolet rays passing through the inlet window 2, while the silicon substrate 4 is heated at a temperature within the range of 200°~700° C. Under the conditions, the heat and light exhibit a combined effect of causing and accelerating the following photochemical reaction, which removes the naturally grown oxide film:

$$SiO_2 + 4HCl \rightarrow SiCl_4 + 2H_2O$$

Method of confirming whether naturally grown oxide film is removed

As described above, the naturally grown oxide film is removed as a result of the above chemical action. However, in order to unequivocally demonstrate the complete removal of the natural oxide, some measures have to be worked out since the silicon substrate is so susceptible or prone to oxidation that it is again coated with a natural oxide film almost the moment when taken out of the chamber after the oxide removal treatment.

The following two unit procedures have been devised by the inventors to determine whether the spontaneous grown oxide film has been stripped off the silicon substrate as a result of the pretreatment process in accordance with the invention.

First confirming procedure

The first procedure involves depositing an oxygen-free thin film such as a silicon nitride film over the silicon substrate surface after it has been stripped of the natural oxide film by the pretreatment of the invention. Following the deposition of the oxygen-free silicon nitride thin film on the silicon substrate, the elemental spectral profile is observed in the thickness direction using Auger electron spectroscopic analysis and the like. With this technique, the presence of oxygen is determined at the interface between the silicon surface (Si) of the substrate and the deposited film ($Si_3N_4$). The presence or absence of oxygen at the interface indicates whether or not the spontaneous oxide film has been grown at the area.

Figure 2A:
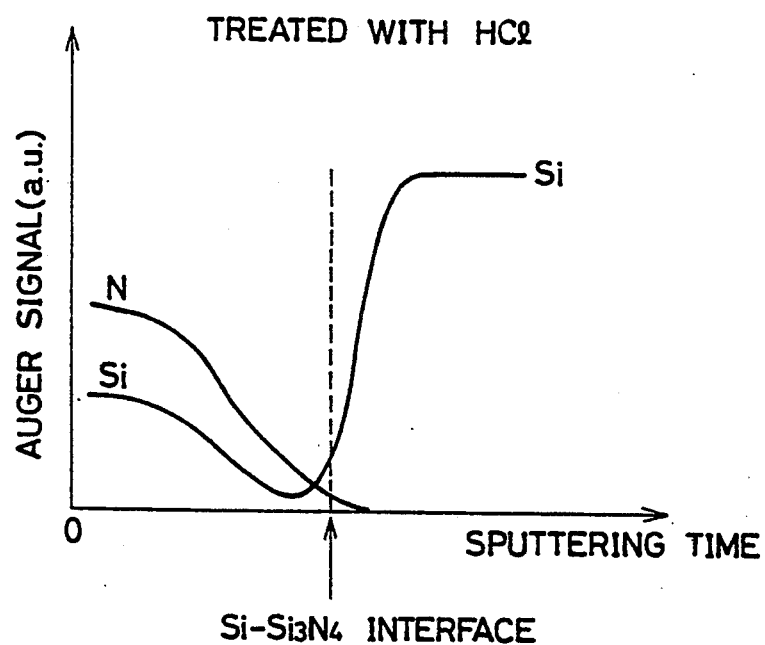
FIGS. 2A and 2B are graphic representations for describing a first procedure for confirming whether the naturally grown oxide film is removed.

FIG. 2A represents Auger spectrum profiles of a sample silicon substrate taken in its thickness direction by the Auger electron spectroscopic analysis. The surface was first subjected to the pretreatment of the invention. Upon the completion of the removal of the naturally grown oxide film, it was coated with a silicon nitride film by chemical vapor deposition or CVD. The sample silicon substrate was prepared as follows.

Referring again to FIG. 1, a silicon substrate 4 was placed on the support 5 after it had been cleaned with a solution or solutions in a preceding step. While being carried over into the chamber 3 of the apparatus, the silicon substrate was exposed to the surrounding air and, as a result, it was coated with a naturally grown oxide film. Upon positioning the silicon substrate 4 on the support 5, HCl gas was introduced into the chamber 3 through the HCl gas inlet 6 in order to keep the substrate surface in contact with the HCl gas. While it was exposed to the gas for several minutes, the silicon substrate was heated up to a temperature of 200°~700° C. under exposure to the ultraviolet radiation from the mercury lamp 1. With this procedure, the spontaneously grown oxide film on the silicon substrate is expected to be stripped off. The remaining HCl gas in a chamber was exhausted by the gas outlet 9. Thereafter, by supplying $SiH_2Cl_2$ gas through the second inlet 7 and $NH_3$ gas through the third inlet 8, a CVD film of silicon nitride was formed on the substrate 4. The resulting silicon substrate was used as a test sample to be analyzed by the Auger electron spectrography. The result of the Auger electron analysis conducted on the sample substrates are illustrated in FIG. 2A where the ordinate represents the intensity of the Auger signal, while the abscissa the sputtering time. It can be seen that, with the samples of silicon substrate which have been preheated with the HCl gas, no Auger signal appeared at or in the neighborhood on the interface between the silicon substrate and the $Si_3N_4$ film that indicates the presence of oxygen.

Figure 2B:
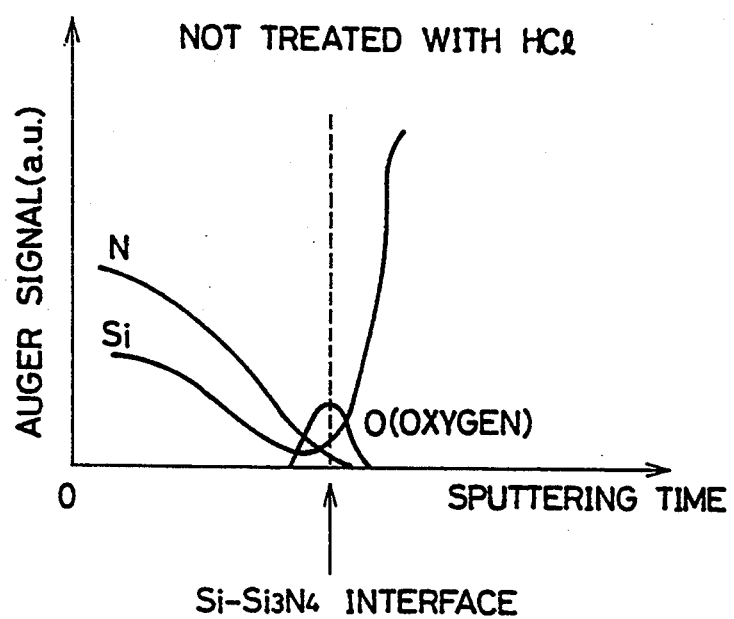

A similar Auger electron spectroscopic analysis was carried out on another sample silicon substrate which had not been pretreated with the HCl gas but had been covered with a coating of silicon nitride ($Si_3N_4$) as in the first sample. The obtained results are illustrated in FIG. 2B. An Auger signal for oxygen was found in the vicinity of the interface between the silicon substrate surface and the silicon nitride coating, which clearly indicates the formation and presence of an oxide film on the substrate surface.

In comparing the analyzed results of the first pretreated silicon substrate with those of the second non-pretreated silicon substrate, it can be concluded that the pretreatment process of the invention is effective to remove the spontaneous oxide film formed on the silicon substrate.

Second confirming procedure

Another procedure to determine if the naturally grown oxide film has been stripped off involves causing photoelectrons to be emitted from the silicon substrate by exposing the substrate to ultraviolet irradiation subsequently to the pretreatment of the substrate. The amount of photoelectron emission, i.e. the photoelectric currents are measured and compared. This procedure is highly effective since the presence and absence of a naturally grown oxide film have a great influence on the flow of photoelectric current as will be shown hereinafter.

The photoelectric procedure is also advantageous in that the source of the ultraviolet rays employed in the pretreatment process of the invention for removing the natural oxide film can also be used as the ultraviolet source for causing the photoelectron emission. Thus, by measuring the changing photoelectric currents, it is possible to monitor how the oxide film is being removed during the pretreatment process.

Figure 3A:
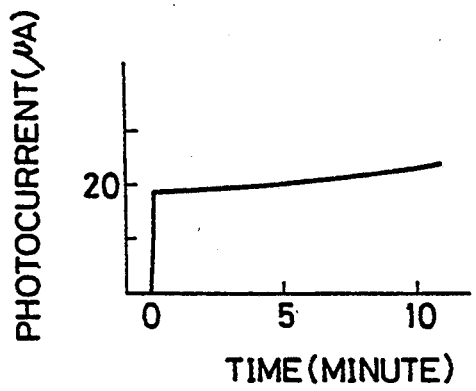
FIGS. 3A and 3B are graphic representations for describing a second procedure for confirming whether the naturally oxide film is removed.
Figure 3B:
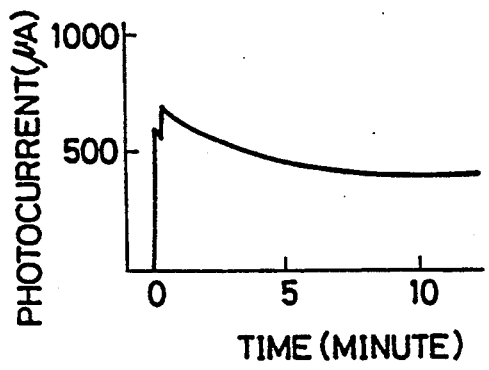

Referring to FIGS. 3A and 3B, a description is given of the relation between presence and absence of the photoelectric current and the naturally grown oxide film. In these figures, the photoelectron current emitted from the start of the irradiation of the ultraviolet rays is measured in an Argon atmosphere at a substrate temperature of 550° C. FIG. 3A shows data when the silicon substrate which was used was exposed to the HCl gas under the ultraviolet irradiation for 15 minutes at 550° C. and it corresponds to FIG. 2A. FIG. 3B shows data when the silicon substrate to which the above treatment was not performed was used and it corresponds to FIG. 2B.

As can be apparent from these figures, if the naturally grown oxide film is removed, the photocurrent is remarkably decreased. Therefore, it is concluded that the decrease in the photocurrent is caused by the removal of the naturally grown oxide film.

In addition, it is readily seen that the conditions of the removal of the oxide film can be monitored by measuring the degree of the decrease in the photocurrent.

Proof of removal of natural oxide film by the concurrent presence of heat and light reactions in the first step In view of the effects of FIGS. 3A and 3B, it is proved that the removal of the naturally grown oxide film in the first step is implemented by a synergistic effect of the heat and photochemical reactions as follows.

Figure 4A:
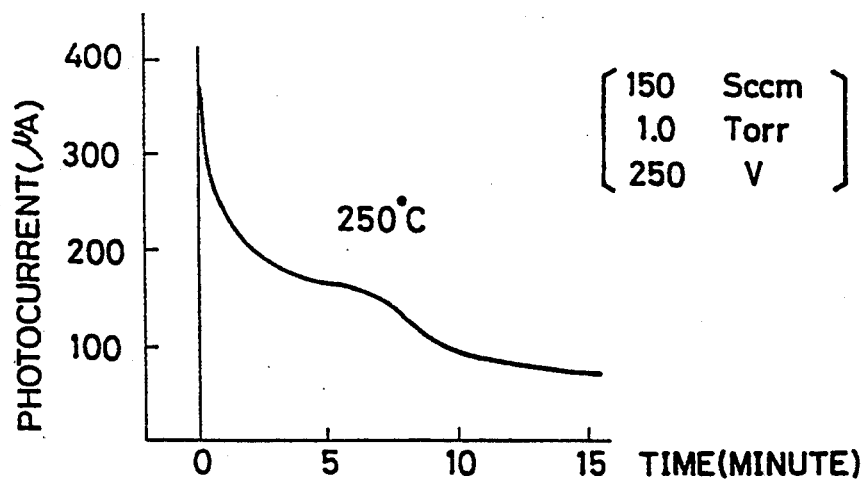
FIGS. 4A, 4B, 4C and 4D are graphic representation showing the temperature effect on a first process of the present invention.
Figure 4B:
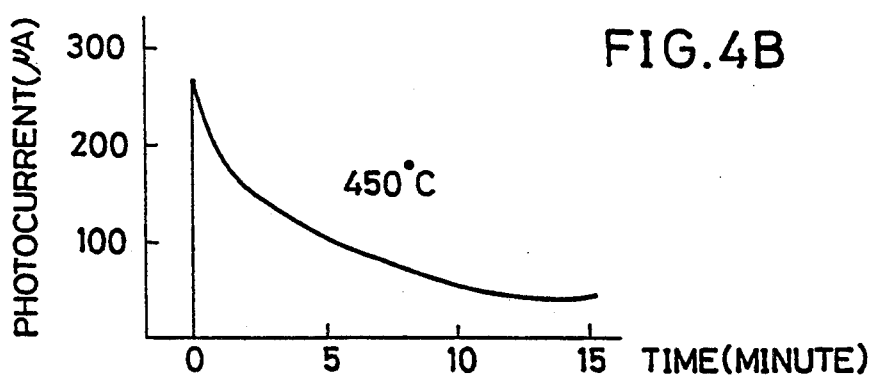
Figure 4C:
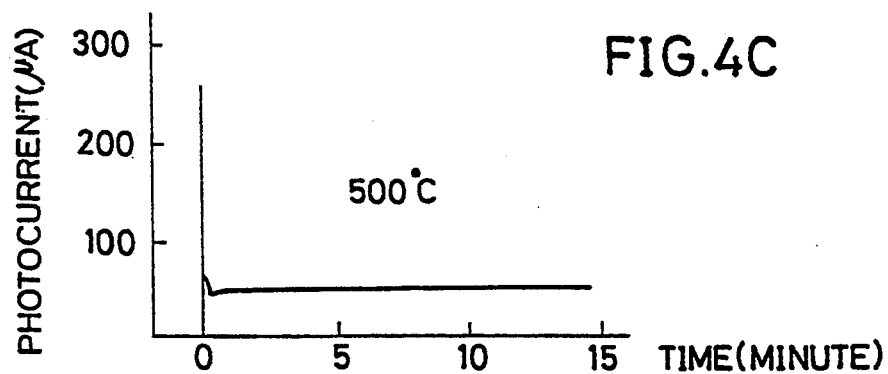
Figure 4D:
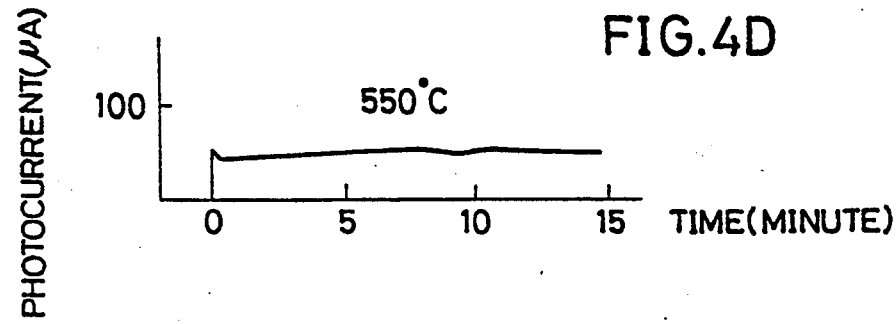

FIGS. 4A, 4B, 4C and 4D show the changes of photocurrent when the natural oxide film is removed at respective temperatures shown in those figures. More specifically, the temperature dependency on the method of removing the natural oxide film in the first step is shown. FIG. 4A shows the change of photocurrent with the temperature of the substrate at 250° C. FIG. 4B shows the change of photocurrent with the temperature of the substrate at 450° C. FIG. 4C shows the change of photocurrent with the temperature of the substrate at 500° C. FIG. 4D shows the change of photocurrent with the temperature of the substrate at 550° C. In these figures, the abscissa shows time (minutes) and the ordinate shows a photocurrent ($\mu$A). The photocurrent was measured by the steps of placing the semiconductor substrate in an HCl atmosphere at the respective temperatures, opening a shutter for controlling the irradiation time of ultraviolet rays and measuring the amount of current with time. A review of FIGS. 4A to 4D gives as follows:

(1) The photocurrent decreases with the irradiation time of the silicon substrate with the ultraviolet rays at the lower temperatures.

(2) The higher the temperature to which the substrate is subjected during irradiation, the smaller the photocurrent is.

(3) The photocurrent drops to a lowermost level, which is generally the same regardless the temperature.

As previously explained in connection with FIGS. 3A and 3B, the decreased photocurrent is due to the absence of the spontaneous oxide film. Then, the curves in FIGS. 4A and 4B suggested that the higher the temperature of the silicon substrate is, the faster the oxide film is removed, and that the removal of the oxide film is promoted or accelerated by the heat applied to the substrate. According to a data book, hydrogen chloride gas at room temperature and atmospheric pressure can only absorb ultraviolet rays having a wavelength of less than 150 nm. The ultraviolet rays generated by the low pressure mercury lamp with wavelengths of 1849 Å and 2537 Å are essentially incapable of exciting HCl gas and, accordingly, they are ineffective in removing the oxide film. However, when the silicon substrate is heated up to a temperature of 200°~700° C., the naturally grown oxide is actually removed as shown in FIGS. 4A to 4D. This fact indicates that the removal of the spontaneous oxide film is effected through the combined and cooperative action of heat and light energies.

According to the results of FIGS. 4A to 4D, it is noted that the pretreatment of the silicon substrate is preferably and actually performed within relatively short period of time. In order to meet this process requirement, it is desired that the silicon substrate is pretreated at a temperature of 500° C. or more. A temperature around 500° C. may not be defined as a low temperature in the absolute sense of the word. Still, it is sufficiently low as compared to the elevated temperatures employed in the prior art when it is attempted to remove the oxide film solely through application of heat.

Thus, the pretreatment of the silicon substrate at a temperature around 500° C. is a great achievement in a practical point of view.

Figure 5:
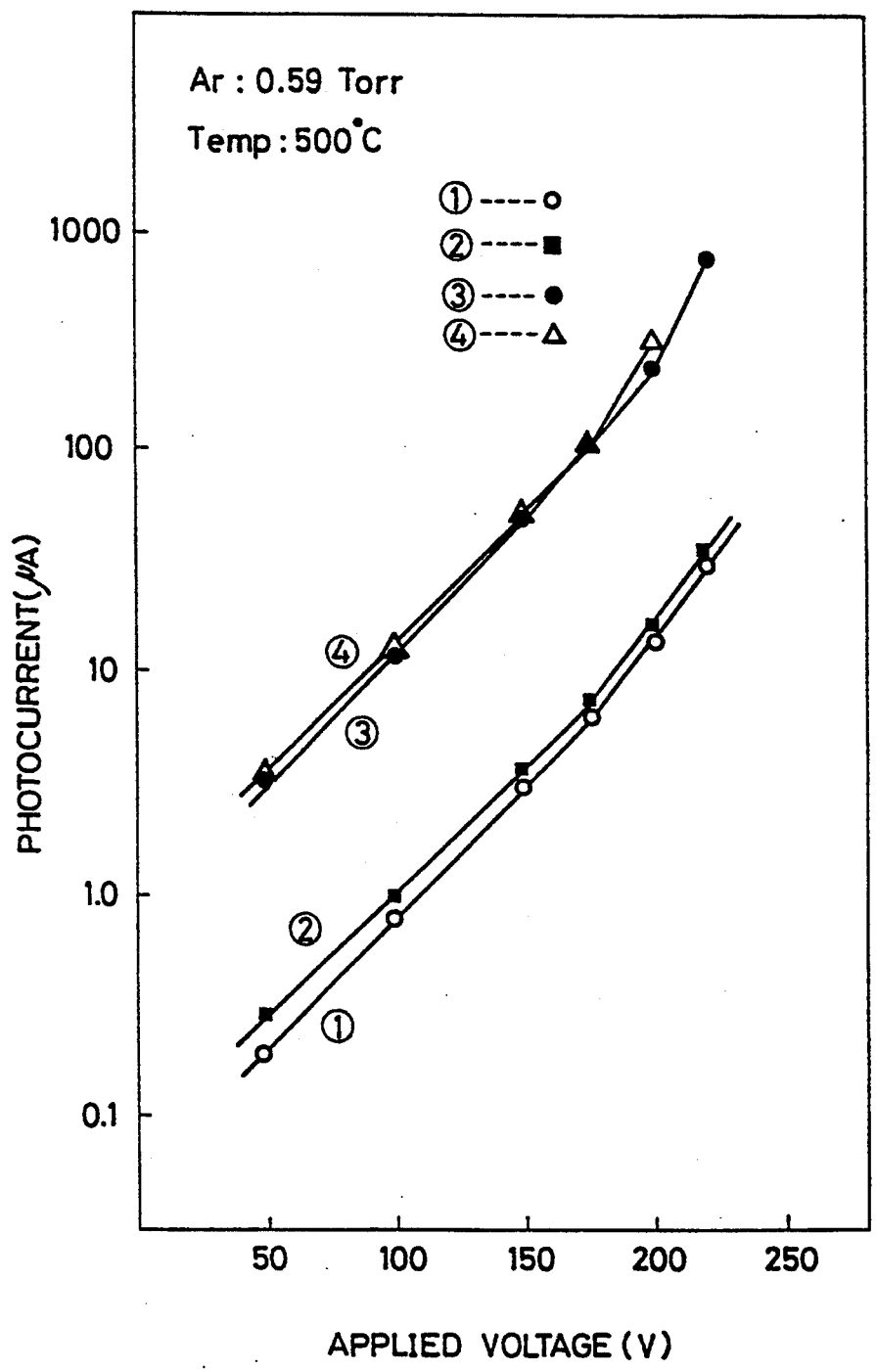
FIG. 5 is a graphic representation showing the effect of the UV radiation on the first process of the present invention.

FIG. 5 shows the effect of the irradiation with the ultraviolet rays in removing the naturally grown oxide film. The apparatus employed is the apparatus shown in FIG. 1 with a photoelectron collecting electrode. The photoelectron collecting electrode in the form of a mesh electrode was placed within the chamber 3 between the substrate support 5 and the ultraviolet ray window 2 (FIG. 1).

While heating the sample substrate to a temperature of 500° C. in the presence of Argon gas, a varying voltage was applied to the photoelectron collector electrode and the photocurrent produced in the sample was measured.

The following four sample silicon substrates were employed in the experiment.

(1) A substrate pretreated for 15 minutes with hydrogen chloride gas at 500° C. under the irradiation of ultraviolet rays. (The first step is performed).

(2) A substrate also pretreated for 15 minutes with hydrogen chloride gas at 500° C. under the irradiation of the ultraviolet rays while a voltage of 250 V is applied to the photoelectron electrode.

(3) A substrate treated with hydrogen chloride gas at 500° C. without the irradiation of the ultraviolet rays for 15 minutes.

(4) A substrate which was not treated at all.

As is apparent from FIG. 5, the photocurrent characteristic is apparently divided into the group consisting of (1) and (2) and the group consisting of (3) and (4). As a result, a comparison between the plotted curves (1) and (3) teaches that the treatment of the silicon substrate with hydrogen chloride gas at an elevated temperature of 500° C. is ineffective to remove the naturally grown oxide film unless under the radiation of the ultraviolet rays. Also, by comparing the plotted curve (1) with the curve (4), it is concluded that it is essential for the removal of the oxide film to expose the substrate to hydrogen chloride. This conclusion coincides with the one which has been drawn in connection with FIGS. 2A, 2B, 3A and 3B.

However, a mere glance at FIGS. 4A to 4D gives rise to a theory that the voltage applied to the mesh collector electrode during the measurements may have created a high intensity electric field, in which hydrogen chloride was turned into plasma, and the plasma has removed the oxide film. This speculation can be dispelled in view of a very slight difference of the generated photocurrent between the substrates (1) and (2).

Referring to FIG. 5, it is also pointed out that a sharp rise in the photocurrent with the increase of voltage applied to the electrode has been a result of the electron multiplication by Argon gas used in the measurement. Thus, there is no significant meaning in the instant argument. All of the foregoing discussion leads to the conclusion that the naturally grown oxide film on the silicon substrate is stripped off in the course of the pretreatment as a result of the synergistic effect of heat and light energy in the presence of a reactive gas. In other words, heat and light cooperate with each other to cause the reactive gas to decompose and remove the oxide film.

The concurrent application of heat and light hence makes it possible to remove the natural oxide film at relatively lower temperatures than is possible with the application of heat alone. Reactive gas that cannot be activated into removing the natural oxide film by the sole application of light can be activated by the method of this invention. Also, the combined use of heat and light with the reactive gas makes it possible to etch the natural oxide film away from the semiconductor substrate at a temperature relatively lower than that employed in the prior art.

Reason that the semiconductor substrate is preferably heated at a temperature within the range of 200°~700° C. in the first step A substrate temperature range during the pretreatment has been selected in the following manner based on an experiment conducted with several sample silicon substrates.

Figure 6:
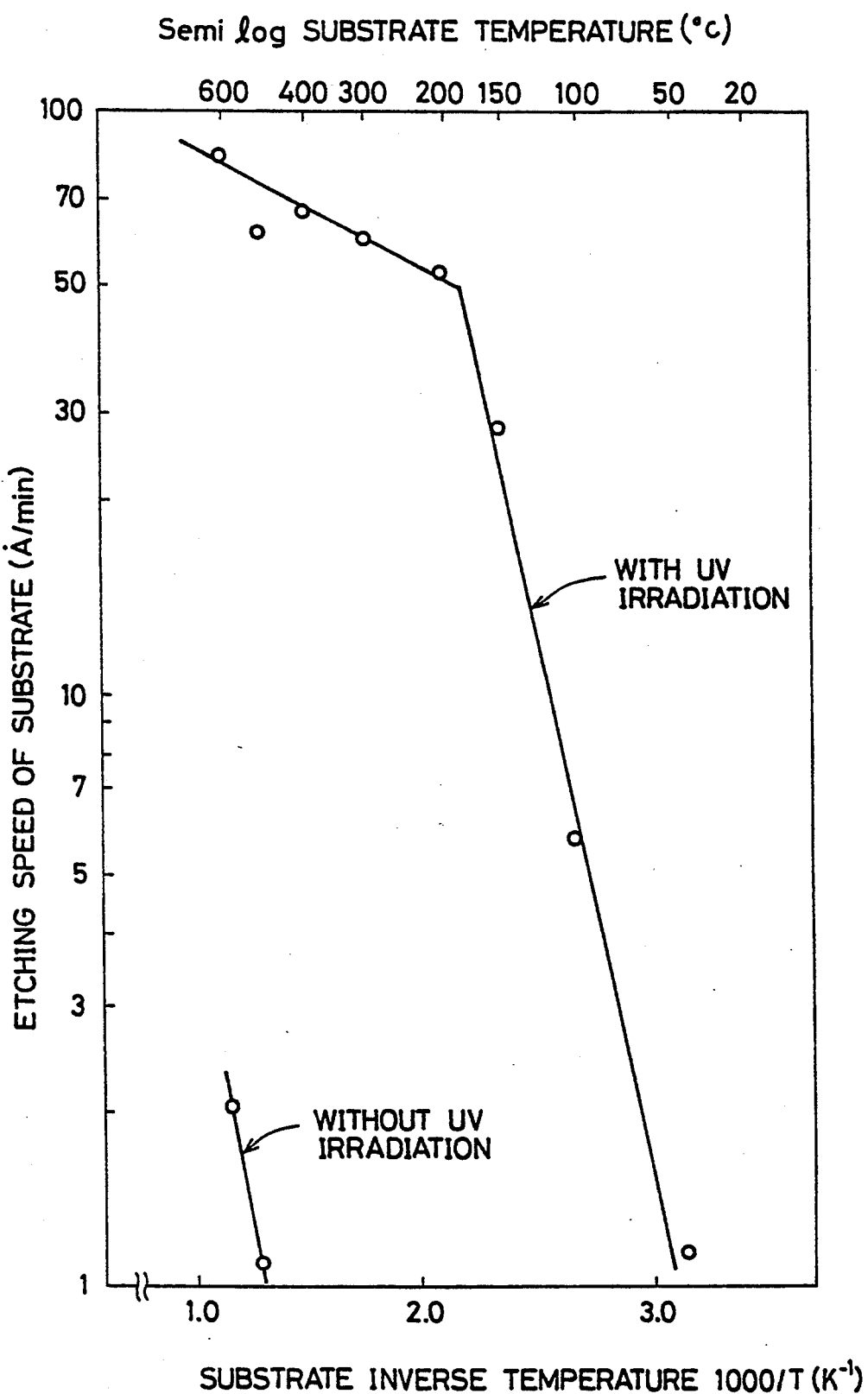
FIG. 6 is an Arrhenius plot showing the relation of the etching rate of the silicon substrate and the temperature employed.
Figure 7A:
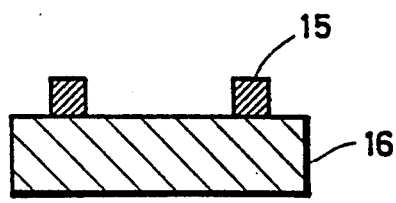
FIGS. 7A, 7B and 7C are sectional views of a semiconductor substrate showing a procedure for determining the etching rate of the silicon substrate.
Figure 7B:
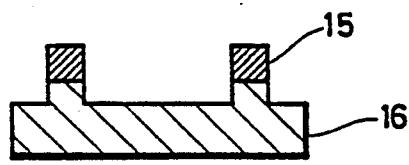
Figure 7C:
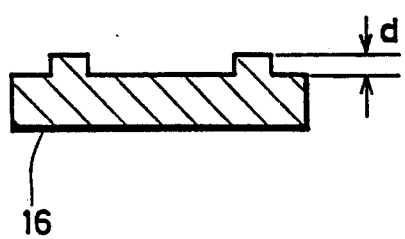

The sample substrate was subjected to dry etching in the presence of hydrogen chloride under exposure to the ultraviolet rays and at varying temperatures. The etching rates of the silicon substrate were observed at different temperatures and the observed etching rates were plotted logarithmically against the inverse temperature 1/T on an Arrhenius chart as shown in FIG. 6. It is noted that the rate of etching of the silicon substrate was determined instead of the naturally grown oxide film since the oxide film is too thin to sense its removal rate. It is assumed that the etching rate of the silicon substrate suggests the rate at which the oxide film is being removed. Before going into a detailed discussion of the Arrhenius plot of FIG. 6, the procedure used to detect the etching rate of the silicon substrate is first explained with reference to FIGS. 7A to 7C. Two types of silicon substrates 16 having resistance of 1~100 Ω·cm were preferred and coated with an oxide mask 15 (FIG. 7A). Etching was performed on the coated substrate while supplying 100% HCl gas at 700 sccm which keeps the ambient pressure at 7.2 Torr. One substrate was under the irradiation of ultraviolet rays from a low pressure mercury lamp during etching, whereas the other was not (FIG. 7B). The etch depth d on the substrate was determined, from which the etching rate was obtainable through calculation.

In this manner, etching rates with the sample silicon substrates at various temperatures were obtained with and without the irradiation of the ultraviolet rays. The obtained results were plotted in etching rate vs. temperature relations on the Arrhenius chart of FIG. 6.

As can be seen in FIG. 6, the etching rate gradually increases over the range from room temperature to 200° C. Above 200° C., the etching rate is seen to accelerate. The abrupt transition of the etching rate at 200° C. indicates that etching proceeds on the substrates at a temperature above 200° C., while below 200° C., no significant etching is taking place. FIG. 6 also shows that the etching rate fails to rise even if the substrate is heated up to as high as 600° C. unless it is under the irradiation of the ultraviolet rays. In other words, no substantial etching takes place even at elevated temperatures without the ultraviolet rays.

The conditions under which the etching of the silicon substrate was observed are similar to those employed for removing the naturally grown oxide film from the silicon substrate. Thus, the findings obtained from the experiment are applicable to the removal rates of the natural oxide film.

It is thus concluded that the naturally grown oxide film on the semiconductor substrate is effectively stripped off by heating the substrate above 200° C. and exposing it to the ultraviolet rays.

As can be seen from FIG. 6, the higher the temperature, the faster the natural oxide film is removed. However, it is reported that at a temperature above 600° C. amorphous silicon is turned into polysilicon (E. Kinsbron, M. Stenheim and R. Knoell, *Appl. Phys. Lett.*, Vol. 42, No. 9, pg. 835, May 1, 1983).

In recent device manufacturing technologies, near amorphous state polysilicon with minimum possible grain size is preferred as the substrate material, and such substrate is preferably heated at a temperature below 600° C. However, polysilicon substrates of this type may be heat-treated at a temperature above 600° C. and still show satisfactory performance and properties as the semiconductor substrate. A heat treatment of the polysilicon substrate at elevated temperatures has an advantage that it can remove the naturally grown oxide film at a faster rate. But care should be taken that the polysilicon substrate is not heated up to a temperature exceeding 700° C. where the above stated advantage is offset by a disadvantage that near amorphous silicon is turned into a polysilicon. Accordingly, the semiconductor substrate may be preferably heat-treated at a temperature within the range of 200°~700° C.

Embodiment of the present invention

Hereinafter, a description is made of an embodiment (the first step+the second step) of the present invention.

Figure 8A:
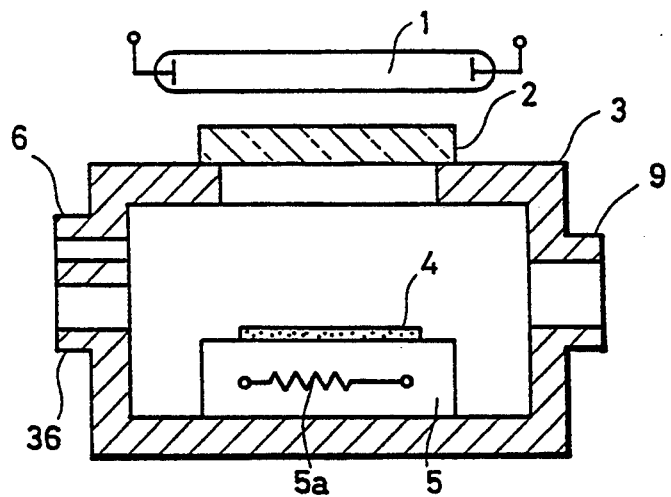
FIG. 8A is a sectional view of an apparatus for carrying out the method of the present invention.

FIG. 8A is a sectional view of an apparatus for implementing the method of forming the thin film in accordance with the first embodiment of the present invention and which apparatus forms the thin film by a chemical vapor deposition method (referred to as a CVD method hereinafter).

Referring to FIG. 8A, the device comprises a chamber 3. The chamber 3 comprises an HCl gas inlet 6, a gas inlet 36 for forming films and an outlet 9. In addition, the chamber 3 comprises a window 2 through which ultra violet rays are irradiated into the chamber 3. A low pressure mercury lamp 1 is placed opposite to the window 2. A substrate supporting plate 5 is placed in the chamber 3 and a silicon substrate 4 is placed on the substrate supporting plate 5. The substrate supporting plate 5 comprises heating means 5a and the silicon substrate 4 can be heated through the semiconductor supporting plate 5.

Next, a description is made of a method of forming the thin film on the semiconductor substrate surface by the CVD method.

Figure 8B:
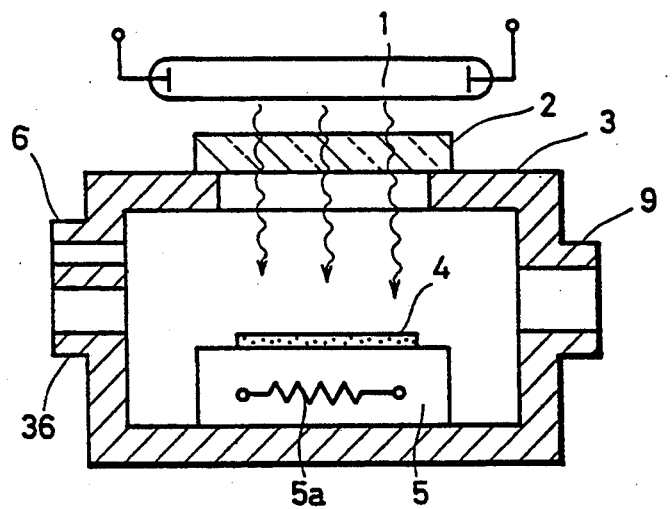
FIGS. 8B and 8C are views showing a method of removing the naturally grown oxide film using the apparatus in accordance with the first embodiment.

Referring to FIG. 8A, the silicon substrate 4 is placed on the substrate supporting plate 5. Although solution treatment was performed on this silicon substrate 4, the naturally grown oxide film has already been generated because it was exposed to the air. Referring to FIG. 8B, HCl gas is introduced into the chamber 3 through the HCl gas inlet 6 and HCl gas is applied to the substrate of the silicon substrate 4. Then, by turning on the low pressure mercury lamp, the surface of the silicon substrate 4 is irradiated with ultraviolet rays from the window 2, while the silicon substrate 4 is heated up to a temperature between 200°~700° C. Then, the following reaction is promoted by the synergistic effect of light and heat, so that the natural oxide film on the silicon substrate 4 is removed:

$$SiO_2 + 4HCl \rightarrow SiCl_4 + 2H_2O$$

Figure 8C:
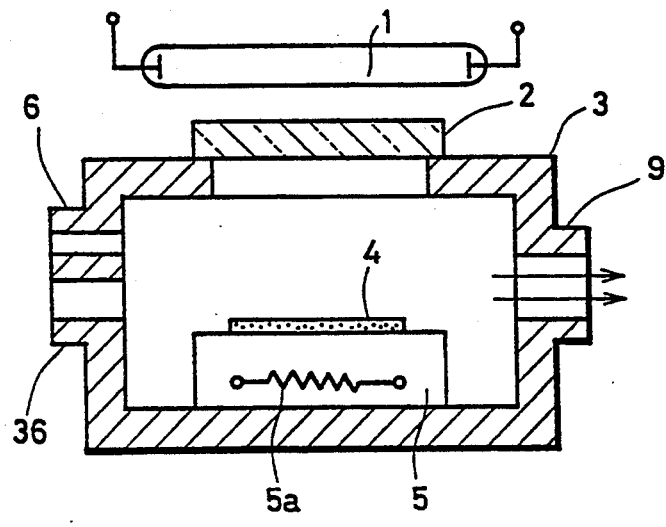

Then, the thin film is formed on the surface of the semiconductor substrate without exposing it to the air. Referring to FIG. 8C, HCl gas is exhausted through the outlet 9. Then, the heating means 5a is operated to heat the semiconductor substrate 4 and a gas for forming films (for example $SiH_2Cl_2 + NH_3$) is introduced through the gas inlet 36, so that the predetermined thin film is formed on the surface of the semiconductor substrate 4.

The natural oxide film and other contaminants on the surface of the semiconductor substrate can be removed at a sufficiently low temperature without damaging the surface of the semiconductor substrate and, thereafter, the thin film is formed thereon, so that the naturally grown oxide film and the like do not intervene in the interface between the semiconductor substrate and the thin film. Therefore, a well controlled interface structure between the semiconductor substrate and the thin film can be obtained.

Second embodiment of the present invention (CVD method)

In the above-mentioned embodiment, a description has been made of the apparatus for forming thin films in which a chamber for removing the naturally grown oxide film and the like (referred to as a pretreatment chamber hereinafter) and a chamber for forming the thin film (referred to as a chamber for the formation of thin film hereinafter) are formed in an integral manner and the natural oxide film can be removed and the thin film can be formed in the same chamber. Alternatively, the pretreatment chamber and the chamber for the formation of thin film may be structured separately. As example of this type of apparatus is shown in FIG. 9 in accordance with the second embodiment of the present invention and it is shown as a sectional view.

Figure 9:
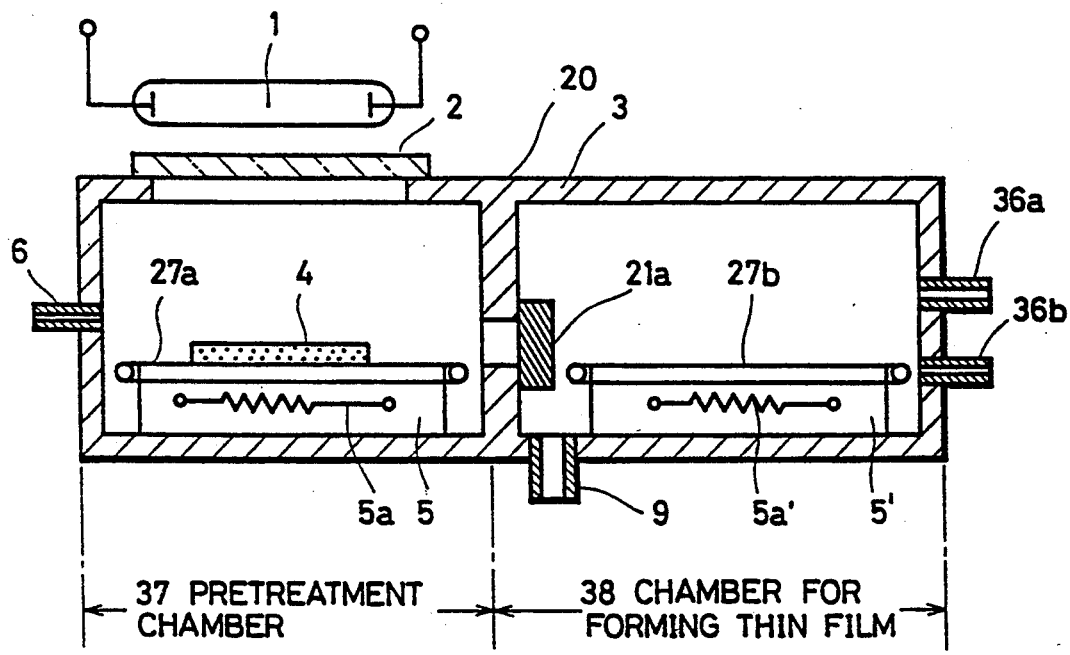
FIG. 9 is a sectional view of an apparatus in accordance with a second embodiment of the present invention.

Referring to FIG. 9, the apparatus comprises a chamber 20. This chamber 20 is divided into a pretreatment chamber 37 and a chamber for the formation of thin film 38 by a lock valve 21a. The chamber 37 comprises an HCl gas inlet 6 and a window 2 through which ultraviolet rays are irradiated into the pretreatment chamber 37. A low pressure mercury lamp 1 is placed opposite to the window 2. A substrate supporting plate 5 is placed in the chamber 37 and a silicon substrate 4 is placed on the substrate supporting plate 5. The substrate supporting plate 5 comprises heating means 5a and the silicon substrate 4 can be heated through the substrate supporting plate 5. In addition, the chamber 37 comprises a carrier system 27a such as a belt conveyer.

In the chamber 38 for the formation of thin film, there are provided gas inlets 36a and 36b for the formation of film and an outlet 9. A substrate supporting plate 5' is placed in the chamber 38. The substrate supporting plate 5' comprises heating means 5a'. The chamber 38 also comprises a carrier system 27b.

A description is now made of a method of forming the thin film on the surface of the semiconductor substrate using the above described apparatus.

Referring to FIG. 9, the silicon substrate 4 is placed on the substrate supporting plate 5 in the pretreatment chamber 37. Although solution treatment was already performed on this silicon substrate 4, the naturally grown oxide film has grown by the exposure to the air. Then, HCl gas is introduced into the chamber 37 through the gas inlet 6 and hydrogen chloride gas is applied to the surface of the silicon substrate 4. Then, by turning on the low pressure mercury lamp 1, the surface of the silicon substrate 4 is irradiated with ultra violet rays through the window 2, while the silicon substrate 4 is heated at a temperature within the range of 200°~700° C. As a result, the naturally grown oxide film adhering to the silicon substrate 4 is removed by the synergistic effect of heat and light.

Then, the lock valve 21a is opened to operate the carrier systems 27a and 27b and introduce the semiconductor substrate 4 to the chamber 38 for the formation of thin film and the silicon substrate 4 is placed on the substrate supporting plate 5'. Opening and closing operation of the lock valve 21a and the operation of the carrier systems 27a and 27b may be performed by, for example externally provided switching means (not shown). Then, the chamber 38 for the formation of thin film is evacuated through the outlet 9. Then, the heating means 5a' is operated to heat the semiconductor substrate, at the same time a gas for the formation of film is introduced into the chamber 38 through the gas inlets 36a and 36b, so that the desired thin film is formed on the surface of the semiconductor substrate.

As the thin film formed by the CVD method, a monocrystalline silicon film (that is, a epitaxial silicon film), a polycrystalline silicon film, an amorphous silicon film or the like may be used. For the formation of the epitaxial silicon film, it becomes possible to form the epitaxial silicon film without any intervention of the natural oxide film in the interface with the semiconductor substrate at a low temperature of approximately 800° C., thus its contact resistance is sufficiently small. For the formation of the polycrystalline silicon film, the naturally grown oxide film which considerably increases contact resistance does not intervene between the substrates. As a result, the polycrystalline silicon wiring having a sufficiently small contact resistance can be formed in a stable state. As the thin film formed by a CVD method, a silicon oxide film used as a gate insulating film or a capacitor insulating film, or an extremely thin insulating film such as a silicon nitride film can be formed. Consequently, an extremely thin insulating film of good quality having no intervention by the natural oxide film in the interface with the semiconductor substrate can be formed. The above-described natural oxide film is different from the silicon oxide film formed through intentional oxidation at a high temperature in that the above-described natural oxide film is not minute and has many defects, so that its voltage resistance is extremely low. When the silicon oxide film or silicon nitride film is formed by a CVD method after the naturally grown oxide film is removed in accordance with the present invention, an extremely imperfect natural oxide film as an insulating film does not exist and, as a result, its insulating characteristic is substantially improved. In addition, for the formation of the silicon nitride film, since the naturally grown oxide film does not exist, there can be provided a thin film whose electric constant is not lowered and which has an extremely good insulating characteristic. In addition, since the silicon nitride film has a larger dielectric constant than the silicon oxide film, it is preferably used as a capacitor insulating film.

After the removal of the natural oxide film, the thin film is made of a high melting point metal such as tungsten, molybdenum, tantalum, titanium or the like, or a silicide compound of these by a CVD method. In either case, the natural oxide film does not exist in the interface, so that a film having extremely low contact resistance can be obtained without any pretreatment.

Third embodiment of the present invention (CVD method)

Figure 10:
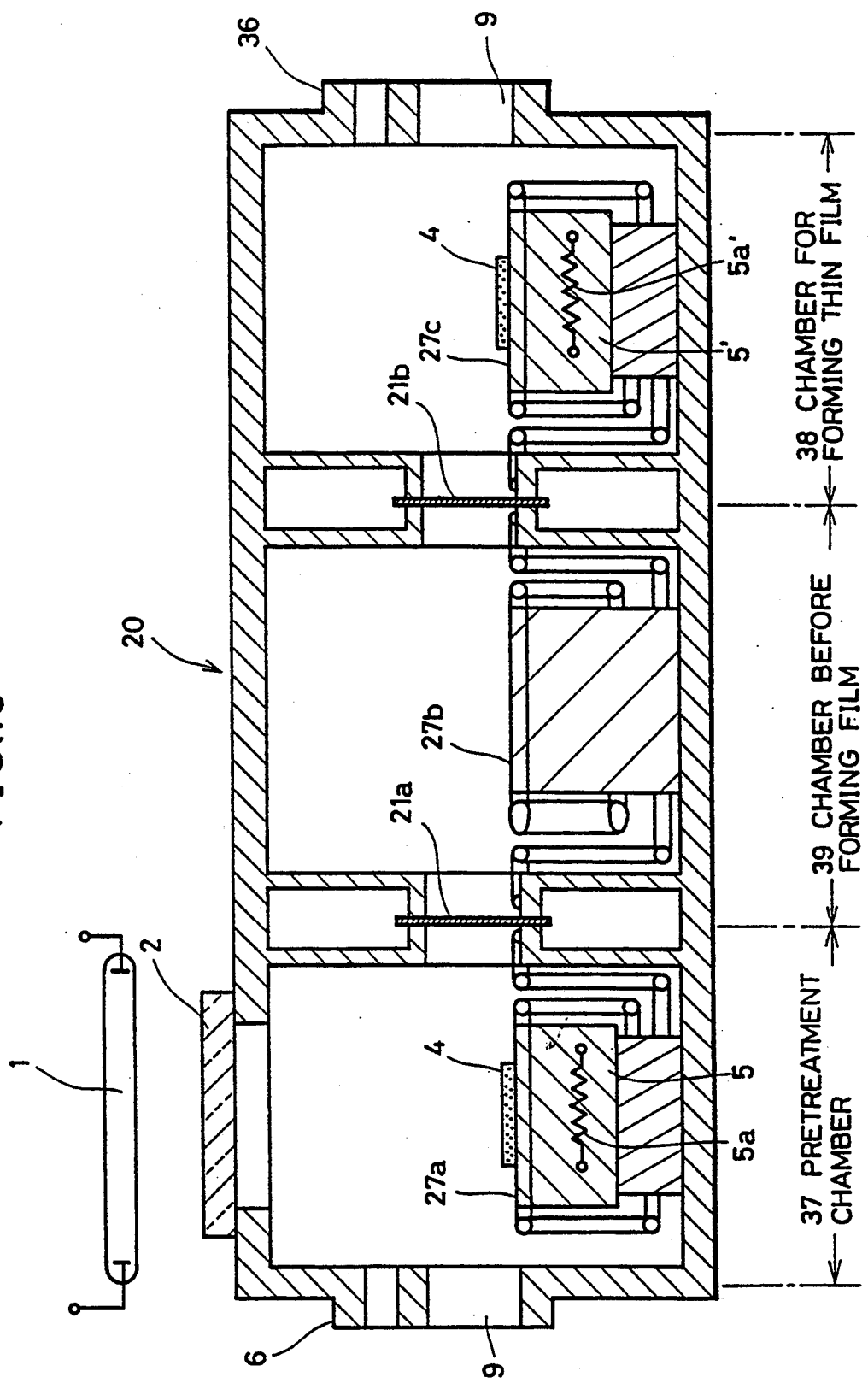
FIG. 10 is a sectional view of an apparatus in accordance with a third embodiment of the present invention.

FIG. 10 is a sectional view of an apparatus for forming a thin film in accordance with the third embodiment of the present invention.

The apparatus comprises a chamber 20 which is divided by lock valves 21a and 21b into a chamber 37 for pretreatment, a chamber 39 before the formation of film and a chamber 38 for the formation of thin film. Referring to FIG. 10, the chamber 37 comprises an HCl gas inlet 6, an outlet 9 and a window 2 for the irradiation of ultra violet rays into the chamber 37. A low pressure mercury lamp 1 is placed opposite to the window 2. A substrate supporting plate 5 is placed in the chamber 37 and a silicon substrate 4 is placed on the substrate supporting plate 5. The substrate supporting plate 5 comprises heating means 5a and the silicon substrate 4 can be heated through the substrate supporting plate 5. In addition, a carrier system 27a for carrying the silicon substrate 4 is provided in the chamber 37.

Another carrier system 27b is placed in the chamber 39. The chamber 38 for the formation of thin film comprises a gas inlet 36 and an outlet 9. A substrate supporting plate 5' is placed in the chamber 38 and a silicon substrate 4 is placed on the substrate supporting plate 5'. The substrate supporting plate 5' comprises heating means 5a' so that the silicon substrate 4 can be heated through the substrate supporting plate 5'. In addition, a carrier system 27c for carrying the semiconductor substrate 4 is placed in the chamber 38.

To form the thin film on the semiconductor substrate 4 using this apparatus, the silicon substrate 4 is placed on the substrate supporting plate 5 in the chamber 37 for pretreatment. Although this silicon substrate 4 had been treated with a solution, it was already exposed to the air and, accordingly, the natural oxide film has been formed thereon. Then, HCl gas is introduced into the chamber 37 through the HCl gas inlet 6 and the HCl gas is applied to the surface of the silicon substrate 4. Then, by turning on the low pressure mercury lamp 1, the surface of the silicon substrate is irradiated with ultra violet rays from the window 2, while the silicon substrate 4 is heated at a temperature between 200° ~700° C. As a result, the naturally grown oxide film on the silicon substrate 4 can be removed by the synergistic effect of heat and light.

Then, the lock valve 21a is opened to operate the carrier system 27a and the semiconductor substrate 4 is introduced into the chamber 39 before the formation of film. In this chamber 39, the gas atmosphere is controlled such that the natural oxide film may not be formed on the surface of the semiconductor substrate again. Then, the lock valve 21a is closed. Thereafter, the lock valve 21b is opened to operate the carrier system 27b and the semiconductor substrate 4 is introduced to the substrate supporting plate 5' in the chamber 38 for the formation of thin film. At this time, if the lock valves 21a and 21b are controlled such that both may not be opened at the same time, residual gas in the chambers 37 and 38 can prevent internal contamination of the chambers 37 and 38.

Then, in the chamber 38 for the formation of thin film, the heating means 5a' is operated to heat the silicon substrate 4, while the gas for the formation of film is introduced into the chamber 38 through the gas inlet 36. As a result, the desired thin film can be formed on the semiconductor substrate 4.

Fourth embodiment of the present invention (sputtering method)

Figure 11:
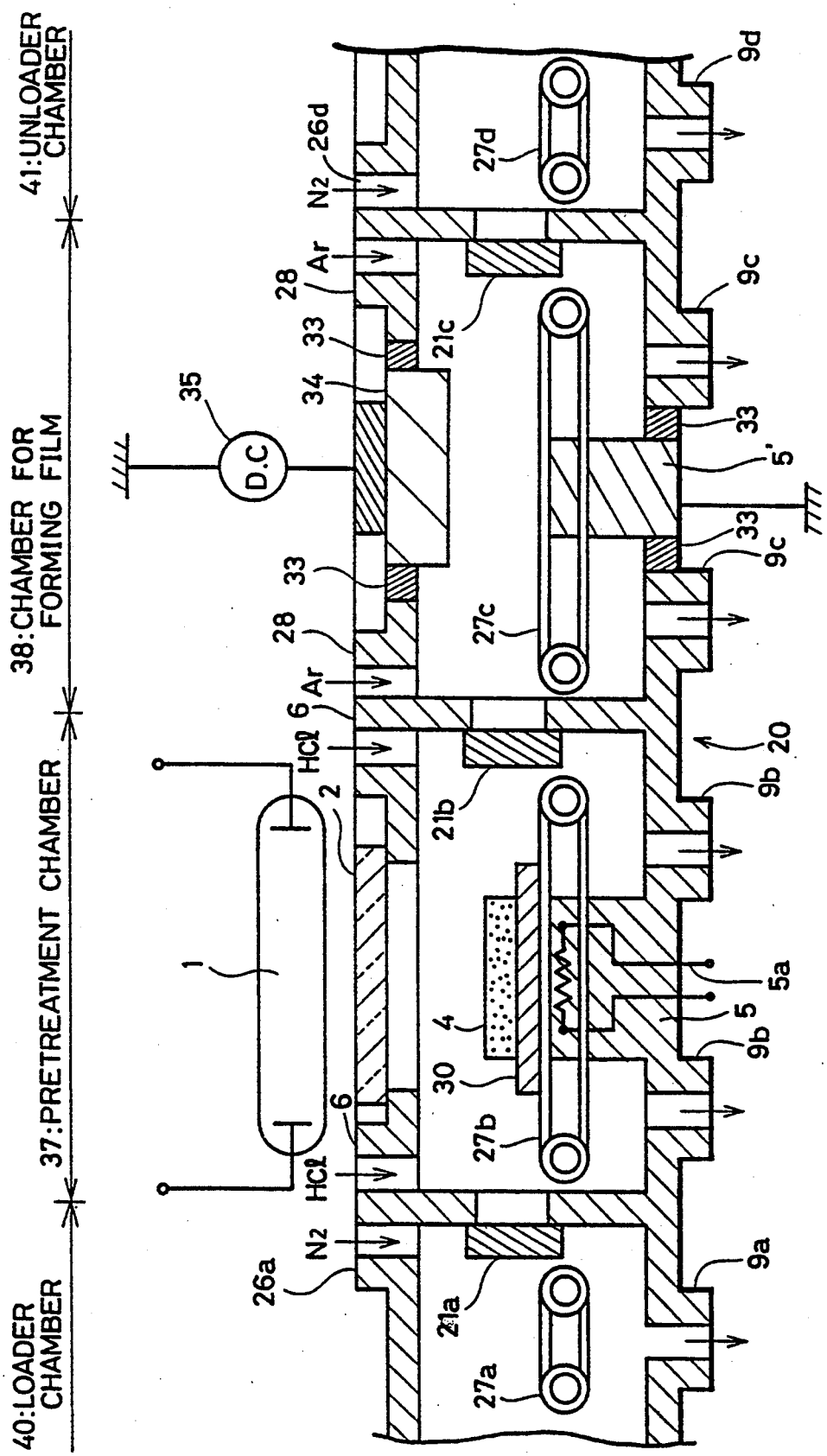
FIG. 11 is a sectional view of an apparatus in accordance with a fourth embodiment of the present invention.

FIG. 11 is a sectional view of an apparatus for the formation of thin film in accordance with the fourth embodiment of the present invention. The apparatus comprises a chamber 20 which is divided by lock valves 21a, 21b, and 21c chamber 40, a chamber 37 for pretreatment, a chamber 38 for the formation of thin film and an unloader chamber 41.

The loader chamber 40 comprises a nitrogen gas inlet 26 and an outlet 9a. In addition, a carrier system 27a is placed in the loader chamber 40.

The pretreatment chamber 37 comprises a HCl gas inlet 6 and an outlet 9b. In addition, a window 2 for irradiation of ultra violet rays into the chamber 37 is provided in the chamber 37. A low pressure mercury lamp 1 is placed opposite to the window 2. A substrate supporting plate 5 is placed in the chamber 37, a tray 30 is placed on the substrate supporting plate 5 and a silicon substrate 4 is placed on the tray 30. The substrate supporting plate 5 comprises heating means 5a and thus the silicon substrate 4 can be heated through the substrate supporting plate 5. Also, a carrier system 27b for the silicon substrate 4 is placed in the chamber 37.

The chamber 38 for the formation of a thin film is a deposition chamber for forming the thin film by sputtering. The chamber 38 comprises an inlet 28 for introducing Argon gas and an outlet 9c. The chamber 38 also comprises a substrate supporting plate 5' and a target 34. The DC power supply 35 is connected to the target 34 such that a high voltage may be applied between the target 34 and the substrate supporting plate 5'. The substrate supporting plate 5' is insulated from the chamber 20 by an insulating portion 33 and the target 34 is insulated from the chamber 20 by the insulating portion 33. A carrier system 27c is placed in the chamber 38.

The unloader chamber 41 comprises a nitrogen gas inlet 26d and an outlet 9d. A carrier system 27d is provided in the unloader chamber 41. The chamber 20 is made to be airtight and can be evacuated to a high degree by an vacuum pump through the outlets 9c and 9d.

A description is now made of a method of forming the thin film on the semiconductor substrate using this apparatus.

First, the loader chamber 40, the chamber 37 for pretreatment, the chamber 38 for the formation of thin film and the unloader chamber 41 are evacuated to a high degree, respectively.

Then, nitrogen gas is introduced to the loader chamber 40 held in the vacuum state through the inlet 26a and then the pressure in the loader chamber 40 is returned to below atmospheric pressure. Then, a plurality of silicon substrates 4 on the tray 30 are introduced into the loader chamber 40 by a cassette and the door is closed. Then, the loader chamber 40 is evacuated by the vacuum pump through the outlet 9a to a high degree. Then, the lock valve 21a is opened and the motor of the carrier system 27a and to move the silicon substrates 4 on the tray 30 to the chamber 37 and the lock valve 21a is closed. The chamber 37 for pretreatment is evacuated to be in a high degree vacuum state of approximately $10^{-7} \sim 10^{-8}$ Torr. Then, HCl gas having a reduced pressure of $10^{-1}$ Torr is introduced into the chamber 37 through the HCl gas inlet 6 and HCl gas is applied to the surface of the silicon substrate 4. Then, by turning on the low pressure mercury lamp 1, the surface of the silicon substrate 4 is irradiated with ultra violet rays through the window 2, while the silicon substrate 4 is heated at a temperature between 200°~700° C. As a result, the following reaction is accelerated by the synergistic effect of heat and light, and the natural oxide film on the silicon substrate 4 is removed as follows;

$$SiO_2 + 4HCl \rightarrow SiCl_4 + 2H_2O$$

After the naturally grown oxide film and other contaminants on the surface of the silicon substrate 4 are completely removed, the introduction of HCl gas and the irradiation from the low pressure mercury lamp are stopped and HCl gas in the chamber 37 is evacuated to make the inside of the chamber 37 in the high vacuum state.

Then, the lock valve 21b is opened to drive the motor of the carrier system 27b and the silicon substrates on the tray 30 are moved into the chamber 38 for the formation of thin film, and then, the lock valve 21b is closed. At this time, a second plurality of substrates 4 is moving into the chamber 37 for pretreatment. The chamber 38 is also evacuated to a high vacuum state of approximately $10^{-7} \sim 10^{-8}$ Torr. Then, Argon gas of $10^{-3} \sim 10^{-1}$ Torr is introduced into the chamber 38 and plasma is formed by applying a voltage of several hundreds to several thousands of volts between the target 34 and the substrate supporting plate 5' from the DC power supply 35. Argon ions in this plasma collide with the highly negatively charged target 34 on the side of negative high with high energy sufficient to sputter the substance of the target 34. This substance is deposited on the silicon substrate 4 to form the thin film. After the formation of the thin film having a desired film thickness, uniformity and quality, the introduction of Argon gas and the application of voltages are stopped and Argon gas in the chamber 38 is evacuated to make the inside of the chamber 38 in the high vacuum state. Then, the lock valve 21c is opened and the motor of the carrier system 27c driven to move the silicon substrates 4 on the tray 30 to the unloader chamber 41 and the lock valve 21c is closed. At this time, the second plurality of silicon substrates 4 is moved into the chamber 38 for the formation of thin film and the third plurality of silicon substrates 4 is moved into the chamber 37 for pretreatment. In this way, after the naturally grown oxide film is removed, the silicon substrate 4 deposited by sputtering are sequentially housed in a cassette (not shown) in the unloader chamber 41. After the last silicon substrates 4 are housed in the cassette, the pressure in the unloader chamber 41 is returned to atmospheric pressure. The thus treated silicon substrates 4 are taken out of the unloader chamber and sent to a subsequent processing.

Fifth embodiment of the present invention (sputtering method)

Although a description was made of the apparatus for forming the thin film comprising the pretreatment chamber and a separate chamber for the formation of thin film in the fourth embodiment, these chambers may be formed in an integral manner.

Figure 12A:
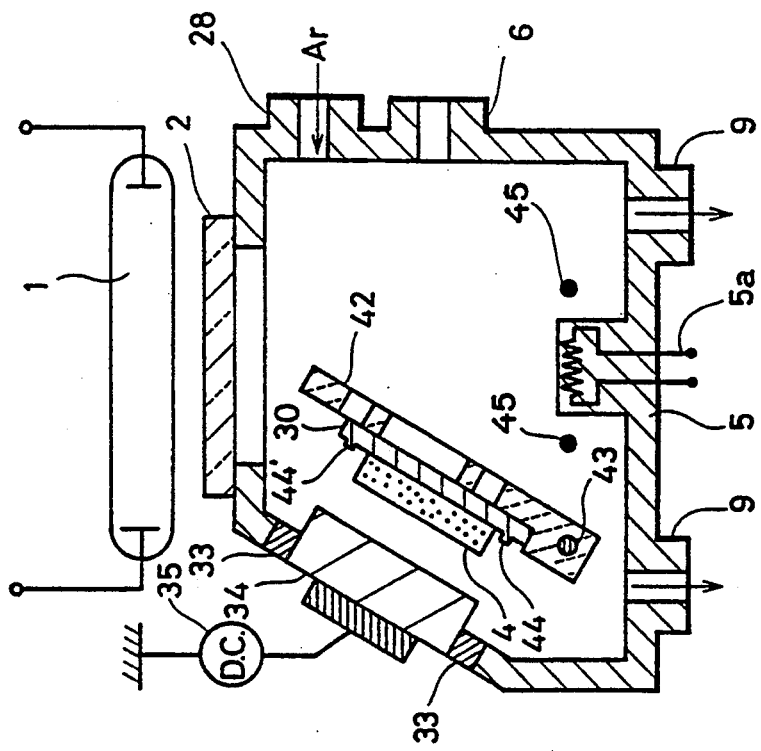
FIGS. 12A and 12B are sectional views of an apparatus in accordance with a fifth embodiment of the present invention.
Figure 12B:
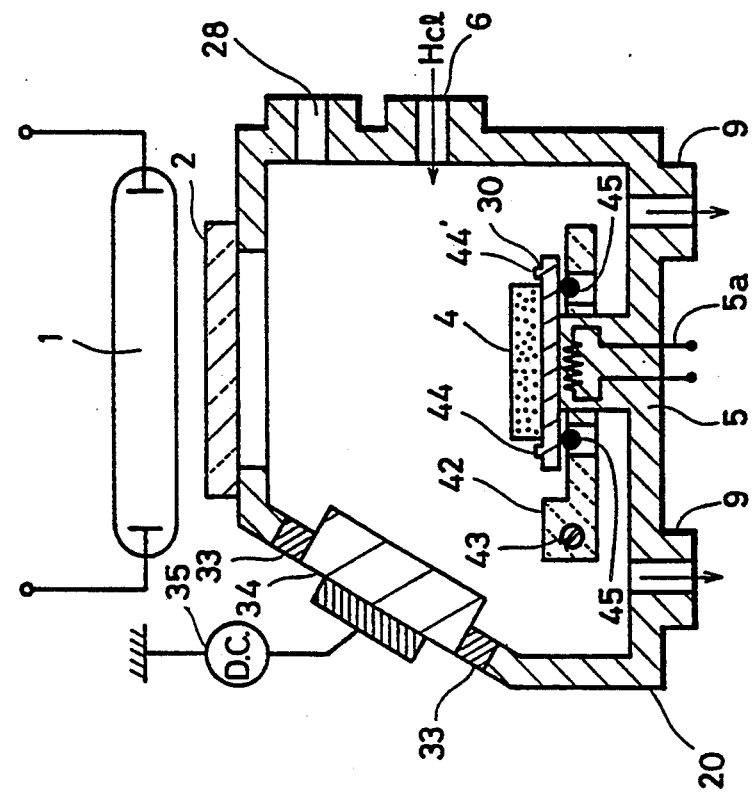

FIGS. 12A and 12B are sectional views of an apparatus for forming the thin film by sputtering in which a chamber for pretreatment and a chamber for the formation of thin film are formed in an integral manner.

Referring to these figures, the chamber 20 comprises an HCl gas inlet 6, an Argon gas inlet 28 and an outlet 9. The chamber 20 also comprises a window 2 for irradiating the ultra violet rays into the chamber 20. A low pressure mercury lamp 1 is placed opposite to the window 2. The chamber 20 also comprises a substrate supporting plate 5. The substrate supporting plate 5 comprises heating means 5a. A target 34 is provided in the chamber 20 and it is insulated from the chamber 20 by an insulating material 33. The DC power supply 35 is connected to the target 34. A platen 42 is placed in the chamber 20 so that it may rotate about a rotation axis 43. The tray 30 is fixed to the platen 42. Convex portions 44 and 44' are provided on the tray 30 and the silicon substrate 4 is placed on the tray 30 such that it may be sandwiched by the convex portions 44 and 44'.

Referring to FIG. 12A, when the chamber 20 is used as a pretreatment chamber, the platen 42 is horizontally oriented with the help of a support 45 and the silicon substrate 4 is opposite to the low pressure mercury lamp 1.

Referring to FIG. 12B, when the chamber 20 is used as a chamber for formation of thin film, the platen 42 is rotated about the rotation axis 43 and the second substrate 4 is opposite to the target 34. When the platen 42 is rotated, the silicon substrate 4 is prevented from sliding down the surface of the platen 42 by the convex portion 44.

A description is made of a method of forming the thin film on the surface of the semiconductor substrate using this apparatus.

Referring to FIG. 12A, the platen 42 is horizontally oriented, while resting on the support 45. Then, the silicon substrate 4 is placed on the tray 30. In this case, the silicon substrate 4 is placed such that it may be sandwiched by the convex portions 44 and 44'. At this time, the silicon substrate 4 is opposite to the low pressure mercury lamp 1. Although the silicon substrate 4 had been treated with solution, it was already exposed to the air, so that the naturally grown oxide film has been formed. HCl gas is introduced into the chamber 20 through the HCl gas inlet 6 and the HCl gas is applied to the surface of the silicon substrate 4. Then, by turning on the low pressure mercury lamp 1, the surface of the silicon substrate 4 is irradiated with the ultra violet rays from the window 2, while the silicon substrate 4 is heated at a temperature between 200°~700° C. Then, the following reaction is accelerated by the synergistic effect of heat and light and the natural oxide film on the silicon substrate 4 is removed.

$$SiO_2 + 4HCl \rightarrow SiCl_4 + 2H_2O$$

After the natural oxide film is removed, the introduction of HCl gas and irradiation from the low pressure mercury lamp 1 are stopped and HCl gas in the chamber 20 is evacuated to make the chamber 20 in the high vacuum state.

Referring to FIG. 12B, the platen 42 is rotated about the rotation axis 43 and the silicon substrate 4 is opposite to the target 34. In this state, Argon gas is introduced through the Argon gas inlet 28 and a high voltage is applied between the substrate supporting plate 5' and the target 34 by the DC power supply 35 to generate plasma. Argon ions in this plasma collide with the target 34 with high energy to sputter the substance of the target 34 and this substance is deposited on the silicon substrate 4. As a result, the thin film is formed on the surface of the silicon substrate 4. After the thin film is formed, the introduction of the Argon gas and the application of a high voltage by the DC power supply 35 are stopped and the Argon gas in the chamber 20 is evacuated to make the chamber 20 in the high vacuum state. Then, the platen 42 is returned to the original horizontal position and then the lock valve (not shown) is opened to move the silicon substrate into the unloader chamber (not shown). Thus a thin film having a well-controlled interface between the semiconductor substrate and the thin film can be formed also by this method.

Sixth embodiment of the present invention

Figure 13A:
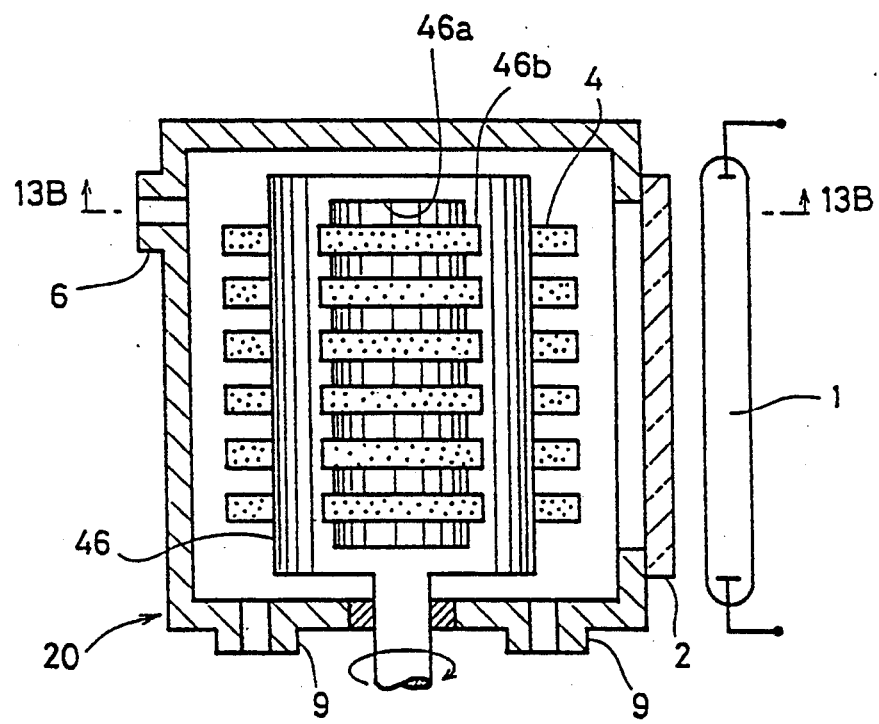
FIGS. 13A and 13B are sectional views of an apparatus of a sixth embodiment of the present invention.
Figure 13B:
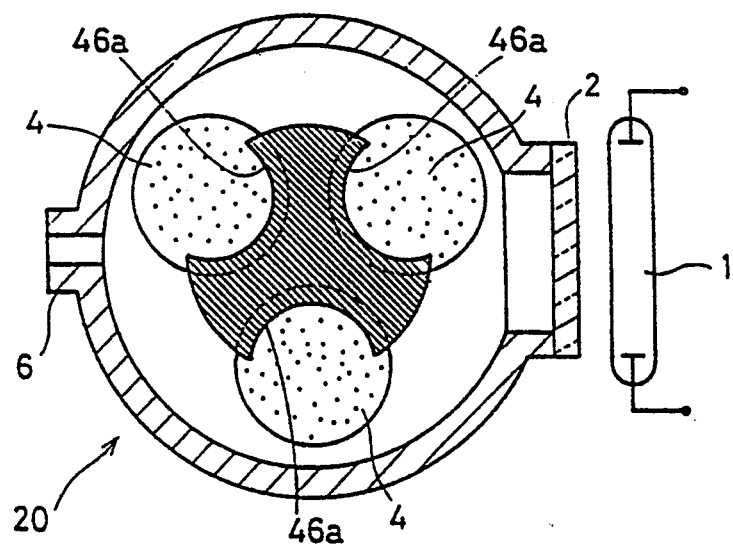

FIG. 13A is a front sectional view of an apparatus for implementing the sixth embodiment of the present invention and FIG. 13B is a sectional view taken along a line 13B—13B in FIG. 13A. This apparatus is a batch-type apparatus capable of processing a large number of silicon substrates. This apparatus comprises a chamber 20. A boat 46 capable of holding a plurality of silicon substrates 4 is placed in the chamber 20. The boat 46 is cylindrical and vertically extending grooves 46a are spaced apart from each other on the sidewall. A plurality of grooves 46b for horizontally holding the silicon substrates 4 are vertically spaced apart from each other by respective grooves 46a. The boat 46 can be rotated about its axis. The chamber 20 also comprises an HCl gas inlet 6 and an outlet 9.

In addition, the chamber 20 comprises a window 2 for the irradiation of the ultra violet rays and this window 2 is placed so as to partially irradiate silicon substrates 4 with light in parallel. A light source such as a low pressure mercury lamp 1 is placed opposite to the window 2.

Next, a description is made of a method of forming the thin film on the surface of the semiconductor substrate using this apparatus.

The boat 46 holds the plurality of silicon substrates 4. Although the silicon substrates 4 had been treated with a solution, they were already exposed to the air and the naturally grown oxide film has been formed on the surface. Then, the chamber 20 is evacuated. Then, a reaction gas such as HCl gas is introduced through the HCl gas inlet 6 at the same time the surface of the silicon substrates 4 in the chamber 20 and the introduced reaction gas such as hydrogen chloride gas and the like are irradiated with the ultra violet rays from the light source such as the low pressure mercury lamp 1 through the window 2. At the same time, the silicon substrates are heated at a temperature between 200°∼700° C. by the heat produced by light irradiation. The natural oxide film and the like on the semiconductor substrate can be removed by this heat, the continuously radiated light, and the introduced HCl gas. Thereafter, if the thin film is subsequently formed without being exposed to the air in the same apparatus (means for forming the thin film is not shown) after HCl gas is evacuated through the outlet 9, it is possible to form a thin film having a well-controlled interface structure with the silicon substrate 4. Although the thin film forming means is not shown, it may be the gas inlet formed on the sidewall of the chamber 20 for introducing the gas for the formation of thin film into the chamber 20.

Seventh Embodiment of the Present Invention

Figure 14A:
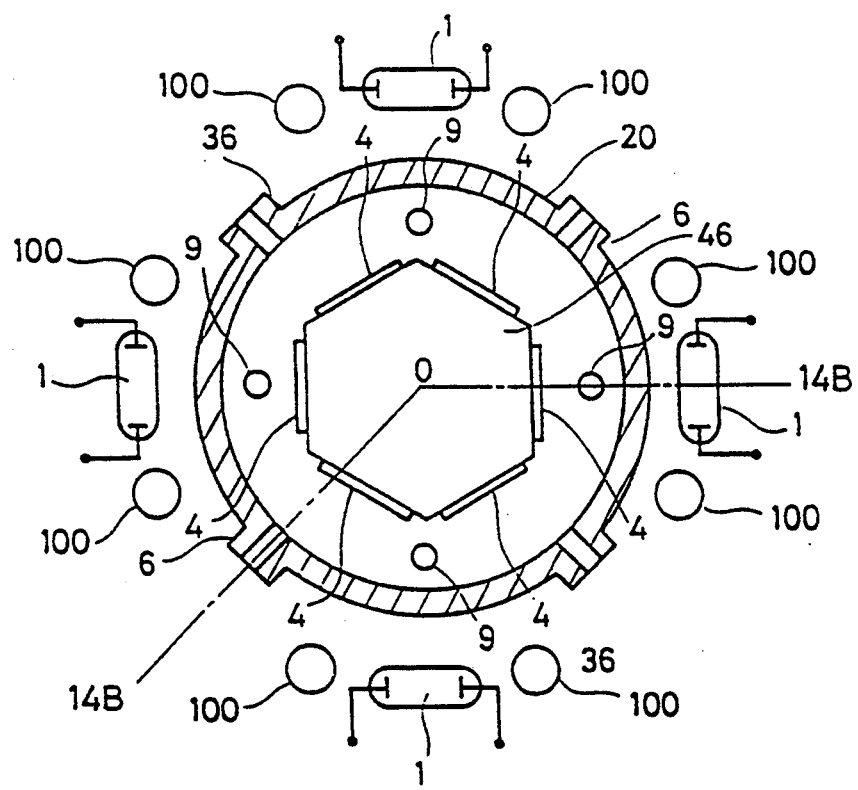
FIGS. 14A and 14B are sectional views of an apparatus of a seventh embodiment of the present invention.
Figure 14B:
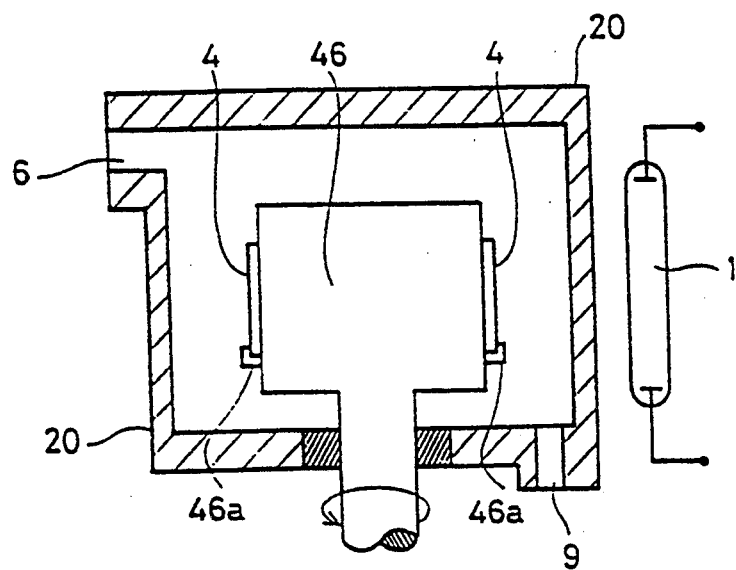
Figure 15:
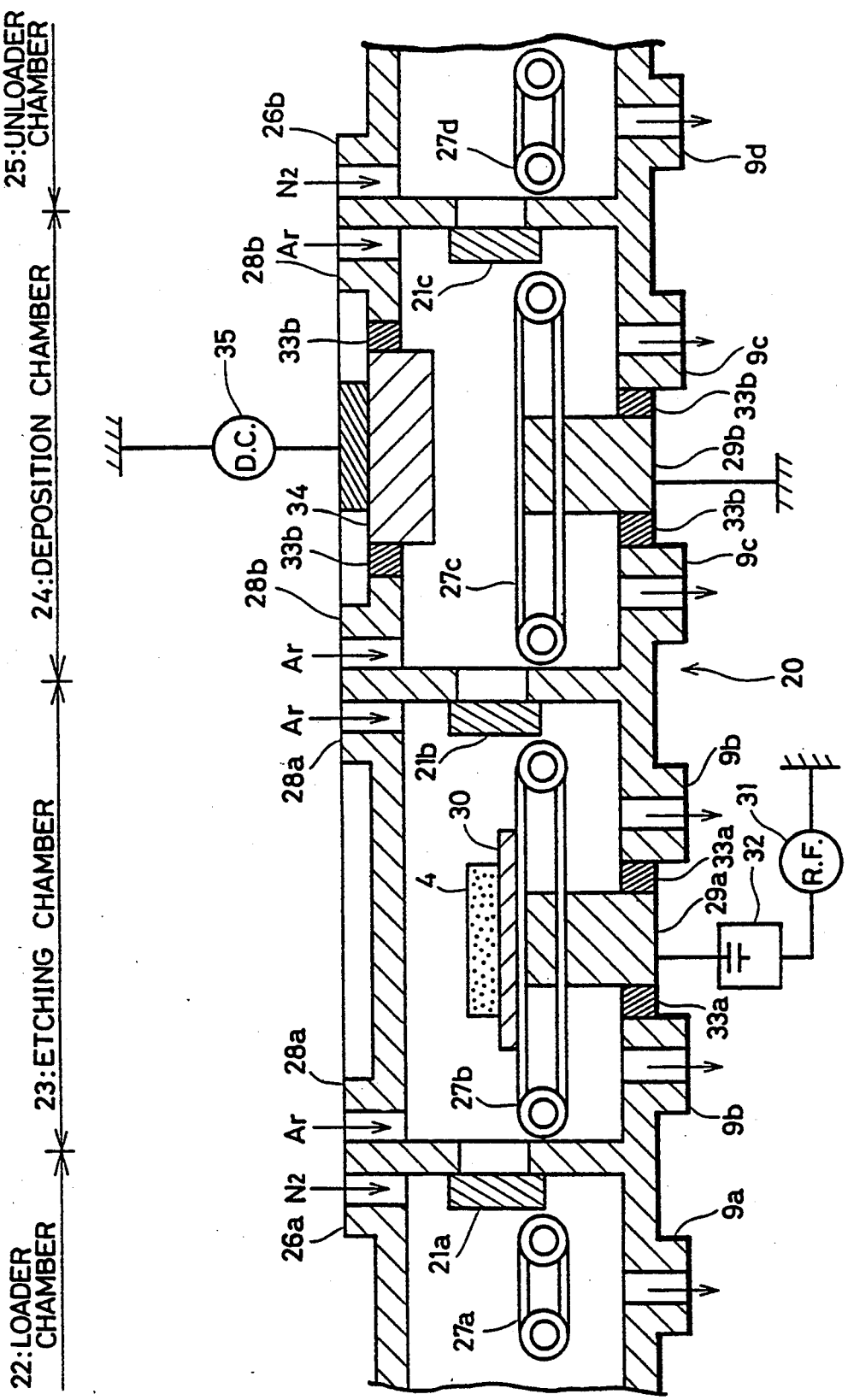
FIG. 15 is a sectional view of a conventional apparatus for the formation of thin film.

FIG. 14A is a sectional view of an apparatus for implementing the seventh embodiment of the present invention and FIG. 14B is a sectional view taken along a line 14B—14B in FIG. 14A.

This apparatus is also a batch-type apparatus capable of processing a large number of silicon substrates. The apparatus comprises a chamber 20. A turret 46 capable of mounting a plurality of silicon substrates 4 is placed in the chamber 20. The turret 46 is in the form of truncated cone and a plurality of pins 46a for holding the silicon substrates 4 are provided on its sidewall. The turret 46 can be rotated about its axis. The chamber 20 comprises an HCl gas inlet 6, an outlet 9 and a gas inlet 36 for the formation of film. A low pressure mercury lamp 1 and an Argon arc lamp 100 are placed around the chamber 20 such that the light from the low pressure mercury lamp 1 and the light from the Argon arc lamp 100 may be introduced into the chamber 20. The Argon arc lamp 100 is a lamp for heating the silicon substrate at a temperature between 200°∼700° C.

Next, a description is made of a method of forming the thin film on the surface of the semiconductor substrate using this apparatus.

The turret 46 holds a plurality of silicon substrates 4. Although these silicon substrates 4 had been treated with a solution, they were already exposed to the air and the natural oxide film has been formed on the surface. Then, the chamber 20 is evacuated through the outlet 9. Then, a reaction gas such as HCl gas is introduced into the chamber 20 through the HCl gas inlet 6. At the same time the surface of the silicon substrate 4 in the chamber 20 is irradiated with the light from the low pressure mercury lamp 1 and the Argon arc lamp 100. At this time, the silicon substrates 4 are heated up to a temperature between 200°∼700° C. by the heat produced from the Argon arc lamp 100. The natural oxide film and the like on the semiconductor substrate can be removed by this heat, the ultra violet rays from the low pressure mercury lamp 1, and the introduced HCl gas. Thereafter, a reaction gas for the CVD method is introduced into the chamber 20 through the gas inlet 36 after HCl gas is evacuated through the outlet 9. Then, the thin film can be formed on the clean surface of the silicon substrate 4. In this way, since the apparatus can subsequently form the thin film on the surface of the silicon substrate 4 without exposing the surface to the air after the cleaning, it is possible to form the thin film having a well-controlled interface structure with the silicon substrate 4.

Although HCl gas was illustrated as a reaction gas in the above embodiment, chlorine gas, hydrogen gas or the like can be used as long as the gas absorbs radiation in the region of the ultra violet rays.

In addition, although a low pressure mercury lamp was used as a light source in the above embodiment, a high pressure mercury lamp, a mercury xenon lamp, an Argon-arc lamp, ArF excimer laser, KrF excimer laser, and XeCl excimer laser may be used. Although the silicon substrate was used as a semiconductor substrate, it is not limited to this.

As described above, according to the present invention, the naturally grown oxide film and other contaminants adhering to the surface of the semiconductor substrate can be removed at a sufficiently low temperature without damaging the surface of the semiconductor substrate. Since the thin film is formed on the thus treated semiconductor substrate surface without exposing the surface to the air the naturally grown oxide film and the like cannot exist in the interface between the semiconductor substrate and the thin film. As a result, the thin film having a well-controlled interface structure with the semiconductor substrate can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of removing a naturally grown oxide film and other contaminants on the surface of a semiconductor substrate and then forming a thin film on the cleaned surface, comprising the sequential steps of:
   placing said semiconductor substrate in a pretreatment chamber;
   introducing into said pretreatment chamber a reaction gas selected from the group consisting of chlorine gas and fluorine gas capable of reacting with said naturally grown oxide film and said other contaminants;
   heating said semiconductor substrate at a temperature greater than 200° and up to 700° C.;
   irradiating said reaction gas with light;
   said light having a wavelength capable of performing a photochemical reaction of said naturally grown oxide film and other contaminants on the surface of said semiconductor substrate with the reaction gas introduced into said chamber at said temperature, while said semiconductor substrate is being heated;
   moving said semiconductor substrate to a chamber for the formation of said thin film without exposing it to the air, after removing said naturally grown oxide film and other contaminants on the surface of said semiconductor substrate by said photochemical reaction; and
   forming the thin film on the clean surface of said semiconductor substrate.

2. A method in accordance with claim 1, wherein the removal of said naturally grown oxide film and other contaminants on the surface of said semiconductor substrate and the formation of said thin film are performed in a single chamber by moving said substrate from a pretreatment portion to a thin film formation portion.

3. A method in accordance with claim 1, wherein the removal of said naturally grown oxide film and other contaminants on the surface of said semiconductor substrate is performed in a first chamber and the formation of said thin film is performed in a second chamber.

4. A method in accordance with claim 3, wherein said naturally grown oxide film and other contaminants on the surface of said semiconductor substrate are removed in said pretreatment chamber,
   the semiconductor substrate is subsequently moved into a gas atmosphere which is controlled such that said naturally grown oxide film is not formed again, and
   the semiconductor substrate is then moved into said chamber for the formation of said thin film to form said thin film.

5. A method in accordance with claim 1, wherein said light is ultra violet rays.

6. A method in accordance with claim 1, wherein a light source for irradiation of said light comprises a low pressure mercury lamp, a high pressure mercury lamp, a mercury-xenon lamp, an Argon arc lamp, or an excimer laser.

7. A method in accordance with claim 1, wherein the pressure of said reaction gas in said pretreatment chamber is selected in the range from atmospheric pressure to 0.1 Torr.

8. A method in accordance with claim 1, wherein said semiconductor substrate is heated at said temperature by irradiating said semiconductor substrate with light.

9. A method of removing a naturally grown oxide film and other contaminants on the surface of a semiconductor substrate and then forming a thin film on the cleaned surface, comprising the sequential steps of:
   providing a first chamber for removing said naturally grown oxide film and other contaminants, a second chamber for forming said thin film, and a third chamber in which a gas atmosphere is controlled and provided between said first chamber and said second chamber,
   placing said semiconductor substrate in said first chamber;
   introducing into said first chamber a reaction gas capable of reacting with said naturally grown oxide film and said other contaminants;
   removing said naturally grown oxide film and other contaminants on the surface of the semiconductor substrate by irradiating said reaction gas with light and heating said semiconductor substrate at a temperature within the range of 200°-700° C. in said first chamber;
   moving said semiconductor substrate from said first chamber to said third chamber,
   controlling the gas atmosphere in said third chamber such that said naturally grown oxide is not formed again on the semiconductor substrate,
   moving said semiconductor substrate from said third chamber to said second chamber; and
   forming the thin film on said cleaned surface of said semiconductor substrate in said second chamber.

10. A method of removing a naturally grown oxide film and other contaminants on the surface of a semiconductor substrate and then forming a thin film on the cleaned surface by sputtering, comprising the sequential steps of:
    providing a chamber having a light source for irradiating a light into the chamber and a sputtering target placed in the chamber for providing components of the thin film;
    placing said semiconductor substrate in said chamber such that the semiconductor substrate is opposite said light source;
    introducing into said chamber a reaction gas capable of reacting with said naturally grown oxide film and said other contaminants;
    removing said naturally grown oxide film and other contaminants on the surface of the semiconductor substrate by irradiating said reaction gas with light of said light source and heating said semiconductor substrate at a temperature within the range of 200°-700° C.;
    moving said semiconductor substrate such that the semiconductor substrate is generally opposite said sputtering target; and
    forming the thin film on the cleaned surface of said semiconductor substrate by sputtering said target.

* * * * *